US011194397B1

United States Patent
Shin et al.

(10) Patent No.: US 11,194,397 B1
(45) Date of Patent: Dec. 7, 2021

(54) APPARATUS, SYSTEM, AND METHOD FOR ACTUATOR-BASED TOUCH SIMULATION

(71) Applicant: Facebook Technologies, LLC, Menlo Park, CA (US)

(72) Inventors: Dongsuk Shin, Redmond, WA (US); Kevin Shimasaki, Redmond, WA (US); Daniele Piazza, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/810,885

(22) Filed: Mar. 6, 2020

(51) Int. Cl.
*G06F 3/01* (2006.01)
*H01L 41/053* (2006.01)

(52) U.S. Cl.
CPC ............ *G06F 3/016* (2013.01); *G06F 3/011* (2013.01); *H01L 41/053* (2013.01)

(58) Field of Classification Search
CPC combination set(s) only.
See application file for complete search history.

(56) References Cited

U.S. PATENT DOCUMENTS

2019/0384394 A1* 12/2019 Cruz Hernandez ..... G06F 3/017

* cited by examiner

*Primary Examiner* — Deeprose Subedi
(74) *Attorney, Agent, or Firm* — FisherBroyles, LLP

(57) ABSTRACT

The disclosed touch-simulation apparatus includes (1) a set of opposing surfaces and (2) an electric actuator assembly coupled between the set of opposing surfaces, wherein (A) the electric actuator assembly includes an actuator layer and (B) a set of mechanical amplifiers coupled between opposing sides of the actuator layer and the set of opposing surfaces. Various other apparatuses, systems, and methods are also disclosed.

20 Claims, 16 Drawing Sheets

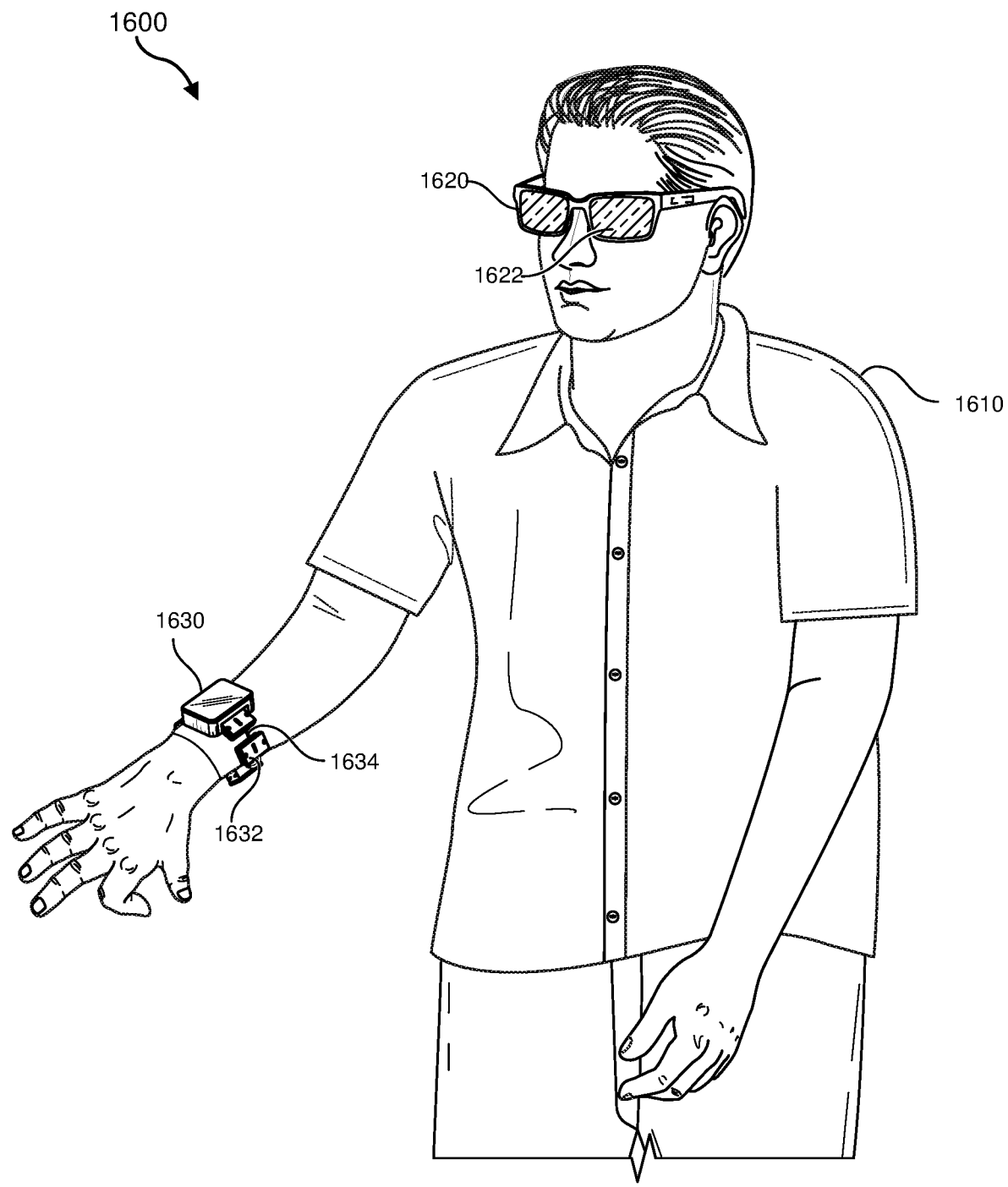

APPARATUS, SYSTEM, AND METHOD FOR ACTUATOR-BASED TOUCH SIMULATION

BRIEF DESCRIPTION OF DRAWINGS AND APPENDIX

The accompanying Drawings illustrate a number of exemplary embodiments and are parts of the specification. Together with the following description, the Drawings demonstrate and explain various principles of the instant disclosure.

FIG. 16 is an illustration of an exemplary augmented reality environment according to embodiments of this disclosure.

Figure 1:
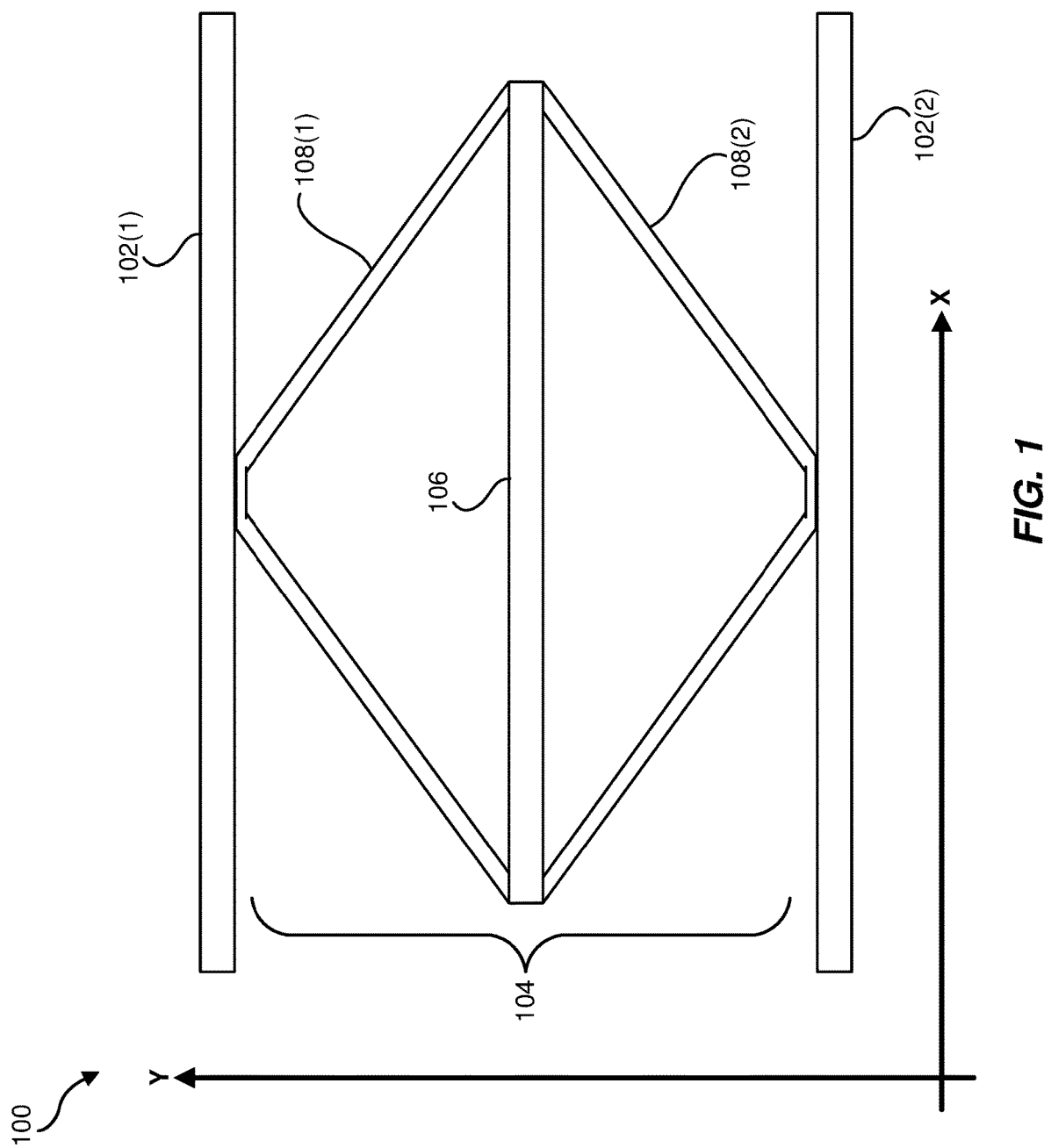
FIG. 1 is an illustration of an exemplary touch-simulation apparatus that may be used in connection with embodiments of this disclosure.

While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, combinations, equivalents, and alternatives falling within this disclosure.

DETAILED DESCRIPTION OF EXEMPLARY EMBODIMENTS

The present disclosure is generally directed to apparatuses, systems, and methods for actuator-based touch simulation. As will be explained in greater detail below, these apparatuses, systems, and methods may provide numerous features and benefits.

Artificial reality often provides a rich, immersive experience in which users are able to interact with virtual objects and/or environments in one way or another. In this context, artificial reality may constitute a form of reality that has been altered by virtual objects for presentation to a user. Such artificial reality may include and/or represent virtual reality, augmented reality, mixed reality, hybrid reality, or some combination and/or variation one or more of the same.

Although artificial reality systems are commonly implemented for gaming and other entertainment purposes, such systems are also implemented for purposes outside of recreation. For example, governments may use them for military training simulations, doctors may use them to practice surgery, engineers may use them as visualization aids, and co-workers may use them to facilitate inter-personal interactions and collaboration from across the globe.

To increase the immersiveness of the users' artificial reality experience, some artificial reality systems may incorporate and/or deploy certain types of haptic feedback. Unfortunately, traditional haptic feedback mechanisms may have certain shortcomings and/or deficiencies that inhibit their effectiveness and/or render them unsuitable for certain applications. For example, the large size of some traditional haptic feedback mechanisms may be unsuitable for use in certain wearable devices (e.g., wristbands). More specifically, such haptic feedback mechanisms may be so big that their use would render certain wearable devices unwieldy, bulky, and/or cumbersome. Additionally or alternatively, some traditional haptic feedback mechanisms may lack the strength and/or force necessary to convey discernible and/or meaningful haptic feedback to users.

The instant disclosure, therefore, identifies and addresses a need for additional apparatuses, systems, and methods for actuator-based touch simulation. As will be described in greater detail below, to achieve and/or impart discernible or meaningful haptic feedback, a wearable device may incorporate and/or deploy one or more relatively compact touch-simulation apparatuses. In one example, each of these compact touch-simulation apparatuses may include a set of opposing surfaces (such as opposing plates and/or different sides of a box enclosure) and an electric actuator assembly coupled between the set of opposing surfaces. In this example, the electric actuator assembly may include and/or represent an actuator layer and/or a set of mechanical amplifiers coupled between opposing sides of the actuator layer and the set of opposing surfaces.

In some examples, the terms "wearable" and "wearable device" may refer to any type or form of computing device that is worn by a user of an artificial reality system and/or visual display system as part of an article of clothing, an accessory, and/or an implant. In one example, a wearable device may include and/or represent a wristband secured to and/or worn by the wrist of a user. Additional examples of wearable devices include, without limitation, pendants, bracelets, rings, jewelry, anklebands, nail tactors (attached to fingernails), clothing, electronic textiles, shoes, clips, headsets, headbands, head-mounted displays, wristbands, gloves, glasses, variations or combinations of one or more of the same, and/or any other suitable wearable accessories.

The following will provide, with reference to FIGS. 1-9, detailed descriptions of various apparatuses, systems, components, and/or implementations for actuator-based touch simulation. The discussion corresponding to FIG. 10 will provide detailed descriptions of an exemplary method for achieving and/or facilitating actuator-based touch simulation. The discussion corresponding to FIGS. 11-16 will provide detailed descriptions of types of exemplary artificial reality devices and/or systems that may facilitate and/or contribute to users' artificial reality experiences.

FIG. 1 illustrates an exemplary touch-simulation apparatus 100 capable of simulating touch for a user via actuator-based haptic feedback. As illustrated in FIG. 1, exemplary touch-simulation apparatus 100 may include and/or represent a set of opposing surfaces 102(1) and 102(2) and an electric actuator assembly 104 coupled between the set of opposing surfaces 102(1) and 102(2). In some examples, electric actuator assembly 104 may include and/or represent an actuator layer 106 and/or a set of mechanical amplifiers 108(1) and 108(2) coupled between opposing sides of actuator layer 106 and the set of opposing surfaces 102(1) and 102(2). In one example, actuator layer 106 may be positioned and/or placed parallel to the set of opposing surfaces 102(1) and 102(2) within touch-simulation apparatus 100.

In some examples, the set of opposing surfaces 102(1) and 102(2) may include and/or represent a set of opposing plates. In other examples, the set of opposing surfaces 102(1) and 102(2) may include and/or represent one plate and a surface of a wearable band. For example, surface 102(1) may include and/or represent a plastic-based plate, and surface 102(2) may include and/or represent a surface of a wearable elastic band secured to the wrist of a user of an artificial reality system. Additionally or alternatively, the set of opposing surfaces 102(1) and 102(2) may include and/or represent different sides of a box enclosure coupled to a wearable band dimensioned to be donned by a user of an artificial reality system.

The set of opposing surfaces 102(1) and 102(2) may include and/or contain any of a variety of materials. In some examples, each of opposing surfaces 102(1) and 102(2) may be formed from one or more plastics. Additional examples of such materials include, without limitation, metals, ceramics, polymers, composites, rubbers, corks, neoprenes, fiberglasses, polytetrafluorethylenes, polymers, silicones moldings, combinations or variations of one or more of the same, and/or any other suitable materials. In one example, opposing surfaces 102(1) and 102(2) may include and/or contain the same or different materials relative to one another.

Each of opposing surfaces 102(1) and 102(2) may be of various shapes and/or dimensions. In some examples, each of opposing surfaces 102(1) and 102(2) may form an oval, a square, and/or a rectangle. Additional examples of shapes formed by opposing surfaces 102(1) and 102(2) include, without limitation, circles, cubes, cylinders, triangles, diamonds, parallelograms, variations or combinations of one or more of the same, and/or any other suitable shapes. In one example, opposing surfaces 102(1) and 102(2) may be of the same or different shapes and/or dimensions relative to one another.

In some examples, each of opposing surfaces 102(1) and 102(2) may be sized in a particular way to optimize the simulation of touch for a user via actuator-based haptic feedback. For example, one or more of opposing surfaces 102(1) and 102(2) may be sized to impart and/or simulate a discernible and/or meaningful touch sensation for the user. Additionally or alternatively, one or more of opposing surfaces 102(1) and 102(2) may be sized to fit within a compact footprint of a designated portion of a wearable device. In one example, opposing surfaces 102(1) and 102(2) may be of the same or different sizes relative to one another. For example, surface 102(1) may be sized larger than surface 102(2) to increase the contact area that touches the user's skin and/or improve the touch-simulation apparatus's ability to transfer vibration to the user's skin.

In some examples, surface 102(1) may be dimensioned for physical contact with the skin of a user of an artificial reality system to facilitate touch simulation for the user in connection with the artificial reality system. Additionally or alternatively, surface 102(2) may be coupled to a wearable band dimensioned to be donned by the user of the artificial reality system. This coupling between surface 102(2) and the wearable band may be made and/or achieved via a variety of different attachment mechanisms. For example, surface 102(2) and the wearable band may be coupled to one another by an adhesive (e.g., silicones, glues, and/or tapes). Additional examples of such attachment mechanisms include, without limitation, sticky surfaces, fasteners, press-fit fastenings, interference-fit fastenings, friction-fit fastenings, slip-fit fastenings, magnetic fasteners, locks, pins, screws, joints, ties, clamps, clasps, stitching, staples, zippers, solder, variations or combinations of one or more of the same, and/or any other suitable attachment mechanisms.

In some examples, the set of mechanical amplifiers 108(1) and 108(2) may include and/or represent extensible and/or retractable barriers or walls. For example, each of mechanical amplifiers 108(1) and 108(2) may be formed in an accordion-like and/or bellows-like configuration or structure. In one example, each of mechanical amplifiers 108(1) and 108(2) may expand and/or amplify commensurate with and/or dependent upon the state of actuator layer 106. In this example, each of mechanical amplifiers 108(1) and 108(2) may expand and/or grow in one dimension or direction (e.g., along the y-axis in FIG. 1).

Additionally or alternatively, each of mechanical amplifiers 108(1) and 108(2) may contract and/or retract commensurate with and/or dependent upon the state of actuator layer 106. In this example, each of mechanical amplifiers 108(1) and 108(2) may contract and/or shrink in one dimension or direction (e.g., along the y-axis in FIG. 1).

The set of mechanical amplifiers 108(1) and 108(2) may include and/or contain any of a variety of materials. In some examples, each of set of mechanical amplifiers 108(1) and 108(2) may be formed from one or more plastics. Additional examples of such materials include, without limitation, metals, ceramics, polymers, composites, rubbers, neoprenes, fiberglasses, polytetrafluorethylenes, polymers, combinations or variations of one or more of the same, and/or any other suitable materials. In one example, mechanical amplifiers 108(1) and 108(2) may include and/or contain the same or different materials relative to one another.

Each of mechanical amplifiers 108(1) and 108(2) may be of various shapes and/or dimensions. In some examples, each of mechanical amplifiers 108(1) and 108(2) may form a cymbal shape (e.g., a round concave shape) atop actuator layer 106. Additional examples of shapes formed by mechanical amplifiers 108(1) and 108(2), without limitation, pyramid shapes, triangular shapes, circles, cubes, cones, cylinders, diamonds, parallelograms, variations or combinations of one or more of the same, and/or any other suitable shapes. In one example, mechanical amplifiers 108(1) and 108(2) may be of the same or different shapes and/or dimensions relative to one another.

In some examples, each of mechanical amplifiers 108(1) and 108(2) may be sized in a particular way to optimize the simulation of touch for a user via actuator-based haptic feedback. For example, one or more of mechanical amplifiers 108(1) and 108(2) may be sized to impart and/or transfer a discernible and/or meaningful touch sensation to the user via one or more of surfaces 102(1) and 102(2). Additionally or alternatively, one or more of mechanical amplifiers 108(1) and 108(2) may be sized to fit within a compact footprint of a designated portion of a wearable device. In one example, mechanical amplifiers 108(1) and 108(2) may be of the same or different sizes relative to one another.

In some examples, mechanical amplifier 108(1) and surface 102(1) may be coupled to one another by any type or form of attachment mechanism. Additionally or alternatively, mechanical amplifier 108(2) and surface 102(2) may be coupled to one another by any type or form of attachment mechanism. For example, mechanical amplifier 108(1) and surface 102(1) may be coupled to one another by an adhesive (e.g., silicones, glues, and/or tapes), and mechanical amplifier 108(2) and surface 102(2) may also be coupled to one another by such an adhesive. In this example, the physical coupling between mechanical amplifier 108(1) and surface 102(1) may increase the contact area intended to touch the user's skin, thereby improving the touch-simulation apparatus's ability to transfer vibration to the user's skin. Additional examples of such attachment mechanisms include, without limitation, sticky surfaces, fasteners, press-fit fastenings, interference-fit fastenings, friction-fit fastenings, slip-fit fastenings, magnetic fasteners, locks, pins, screws, joints, ties, clamps, clasps, stitching, staples, zippers, solder, variations or combinations of one or more of the same, and/or any other suitable attachment mechanisms.

In some examples, actuator layer 106 may expand and/or contract in response to an electric current and/or electrical signal. For example, an electric current and/or electrical signal may cause actuator layer 106 to expand and/or grow in one dimension or direction (e.g., along the x-axis in FIG. 1). Additionally or alternatively, an electric current and/or electrical signal may cause actuator layer 106 to contract and/or shrink in one dimension or direction (e.g., along the x-axis in FIG. 1).

In some examples, actuator layer 106 may include and/or contain any of a variety of materials. In one example, actuator layer 106 may include and/or represent a piezoelectric ceramic component. Additionally or alternatively, actuator layer 106 may include and/or represent charge-storage capacitor that activates and/or causes actuation movement. Examples of actuator layer 106 include, without limitation, single-cell actuators, multi-cell actuators, lever-arm amplification actuators, longitudinal actuators, shear actuators, tube actuators, contracting actuators, combinations or variations of one or more of the same, and/or any other suitable actuator layer.

Actuator layer 106 may be of various shapes and/or dimensions. In some examples, actuator layer 106 may form an elongated flat shape, surface, and/or plate. Additional examples of shapes formed by actuator layer 106, without limitation, squares, rectangles, circles, cubes, cuboids, spheres, cylinders, diamonds, parallelograms, variations or combinations of one or more of the same, and/or any other suitable shapes.

In some examples, actuator layer 106 may be sized in a particular way to optimize the simulation of touch for a user via actuator-based haptic feedback. For example, actuator layer 106 may be sized to impart and/or transfer a discernible and/or meaningful touch sensation to the user via one or more of mechanical amplifiers 108(1) and 108(2) and/or surfaces 102(1) and 102(2). Additionally or alternatively, actuator layer 106 may be sized to fit within a compact footprint of a designated portion of a wearable device.

In some examples, actuator layer 106 and mechanical amplifier 108(1) or 108(2) may be coupled to one another by any type or form of attachment mechanism. For example, actuator layer 106 and mechanical amplifier 108(1) may be coupled to one another by an adhesive (e.g., silicones, glues, and/or tapes), and actuator layer 106 and mechanical amplifier 108(2) may also be coupled to one another by such an adhesive. Additional examples of such attachment mechanisms include, without limitation, sticky surfaces, fasteners, press-fit fastenings, interference-fit fastenings, friction-fit fastenings, slip-fit fastenings, magnetic fasteners, locks, pins, screws, joints, ties, clamps, clasps, stitching, staples, zippers, solder, variations or combinations of one or more of the same, and/or any other suitable attachment mechanisms.

In other examples, actuator layer 106 and mechanical amplifiers 108(1) and 108(2) may collectively form and/or represent a single unit and/or single piece of material. In such examples, the distinction between actuator layer 106 and mechanical amplifiers 108(1) and 108(2) may be made and/or emphasized herein for the purpose of relativity and/or size or dimensional comparison in connection with apparatus 100 and/or electric actuator assembly 104.

Figure 2:
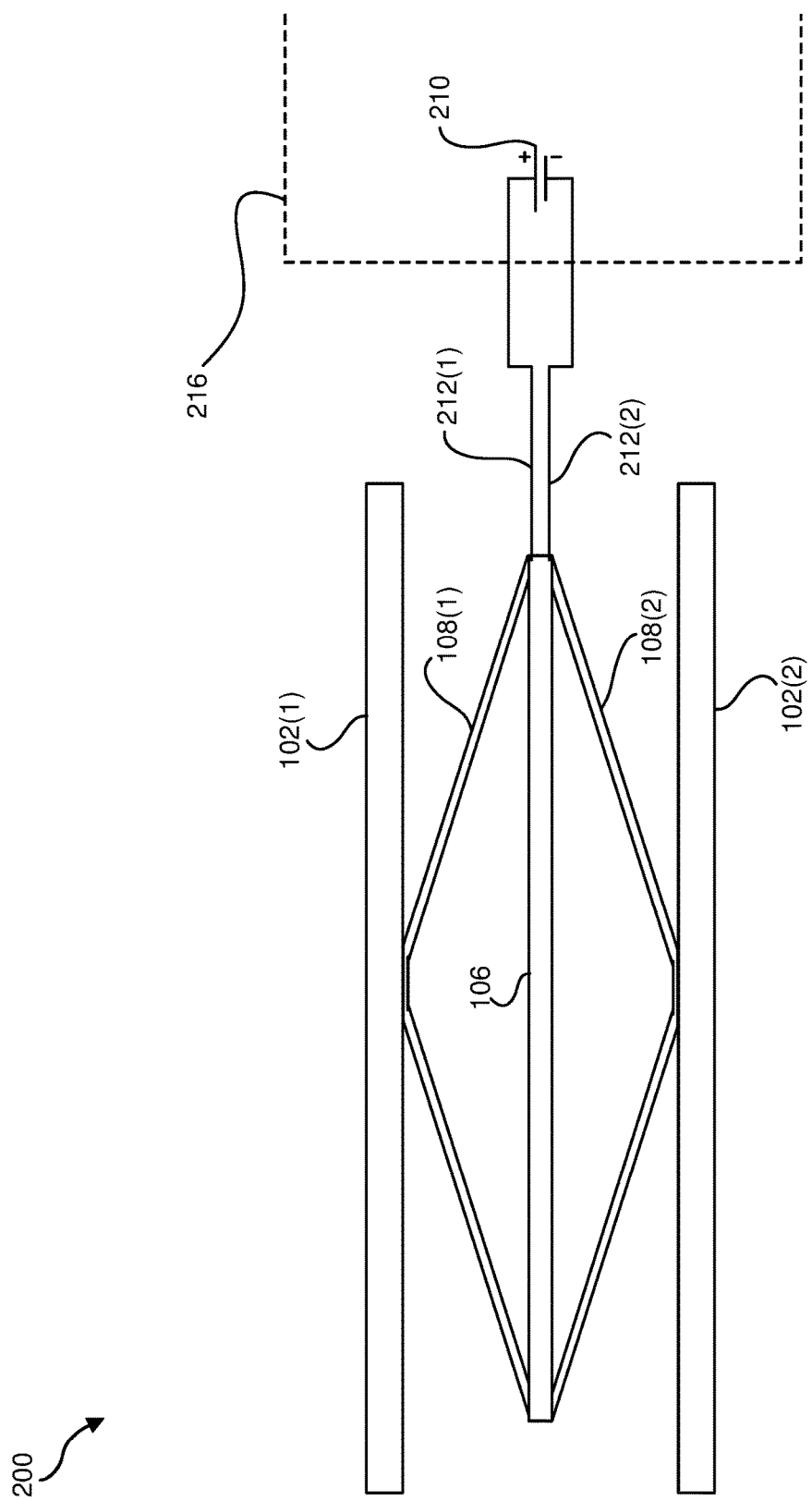
FIG. 2 is an illustration of an exemplary touch-simulation apparatus that may be used in connection with embodiments of this disclosure.
Figure 3:
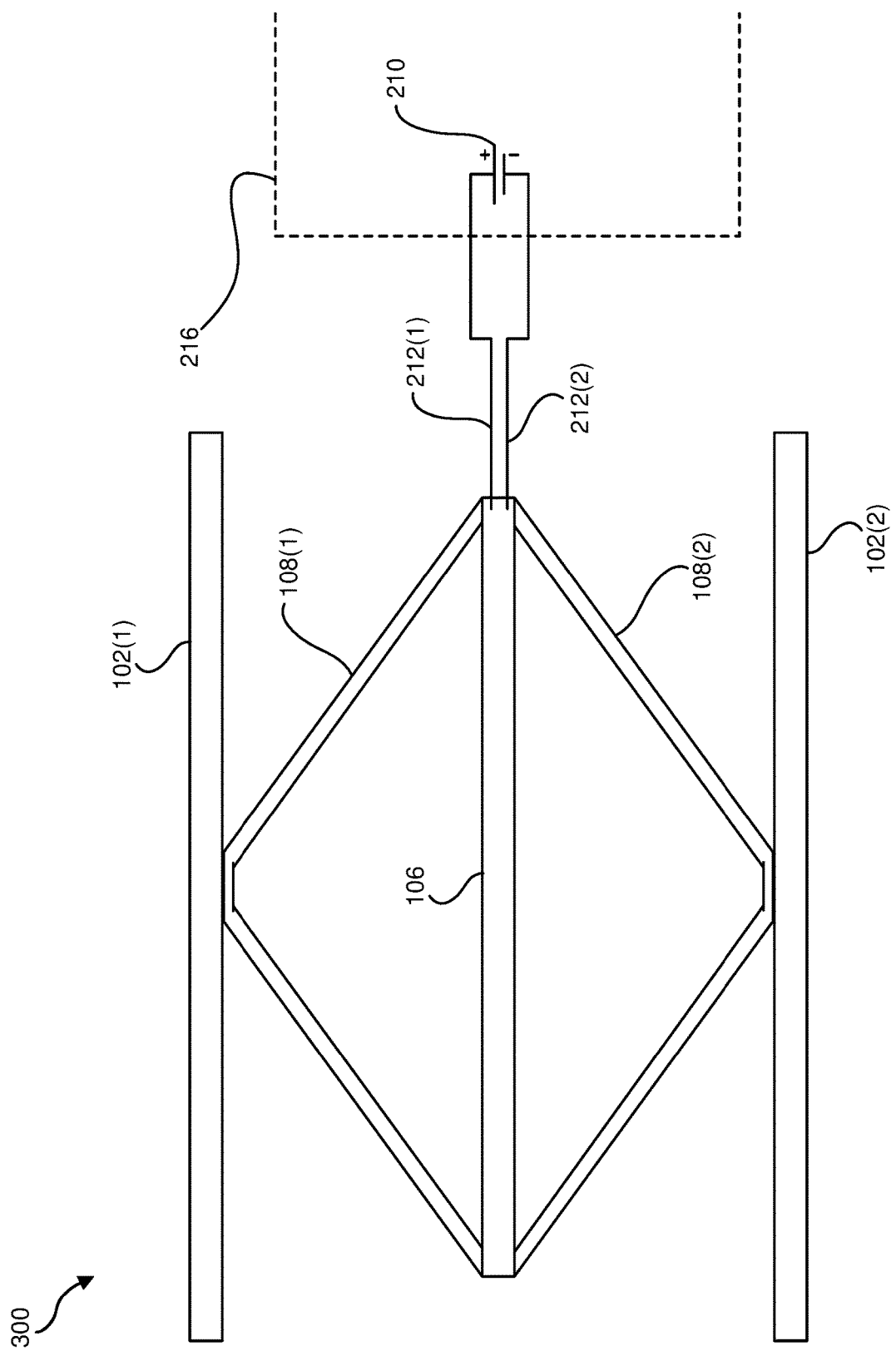
FIG. 3 is an illustration of an exemplary touch-simulation apparatus that may be used in connection with embodiments of this disclosure.

FIGS. 2 and 3 illustrates exemplary touch-simulation apparatuses 200 and 300, respectively, capable of simulating touch for a user via actuator-based haptic feedback. As illustrated in FIGS. 2 and 3, exemplary touch-simulation apparatuses 200 and 300 may each include and/or represent the set of opposing surfaces 102(1) and 102(2) and electric actuator assembly 104 coupled between the set of opposing surfaces 102(1) and 102(2). In some examples, touch-simulation apparatuses 200 and 300 may also include and/or represent one or more electrical leads 212(1) and 212(2) coupled between actuator layer 106 of electrical actuator assembly 104 and an actuation controller 210. In such examples, electrical leads 212(1) and 212(2) may deliver and/or apply electric current from actuation controller 210 to actuator layer 106 of electrical actuator assembly 104 to facilitate actuating actuator layer 106.

In one example, actuation controller 210 may represent part of and/or be included in a physical processor 216. In this example, physical processor 216 may create and/or form actuation controller 210 from one or more input/output (I/O) pins. Additionally or alternatively, actuation controller 210 may include and/or involve part of physical processor 216 and one or more components and/or circuit elements (not necessarily illustrated in FIG. 2) that are external to and/or outside of physical processor 216. For example, actuation controller 210 may include and/or involve one or more I/O pins of physical processor 216 in addition to external current driver circuitry for driving the actuation of actuator layer 106.

In some examples, physical processor 216 may represent any type or form of hardware-implemented processing device capable of interpreting and/or executing computer-readable instructions. In one example, physical processor 216 may interface with and/or be electrically coupled to touch-simulation apparatus 100. Examples of physical processor 216 include, without limitation, Central Processing Units (CPUs), microprocessors, microcontrollers, Field-Programmable Gate Arrays (FPGAs) that implement softcore processors, Application-Specific Integrated Circuits (ASICs), portions of one or more of the same, variations or combinations of one or more of the same, and/or any other suitable physical processor.

In one example, actuation controller 210 may actuate, activate, and/or deactivate actuator layer 106 of electric actuator assembly 104. For example, and as illustrated in FIG. 2, actuation controller 210 may direct and/or cause actuator layer 106 to expand and/or grow. In this example, the expansion and/or growth of actuator layer 106 may cause and/or force the set of mechanical amplifiers 108(1) and 108(2) to contract and/or retract inward toward actuator layer 106. As a result, the set of opposing surfaces 102(1) and 102(2) may also be forced to contract and/or retract inward together with the set of mechanical amplifiers 108(1) and 108(2).

As another example, and as illustrated in FIG. 3, actuation controller 210 may direct and/or cause actuator layer 106 to contract and/or shrink. In this example, the contraction and/or shrinkage of actuator layer 106 may cause and/or force the set of mechanical amplifiers 108(1) and 108(2) to extend and/or amplify outward from actuator layer 106. As a result, the set of opposing surfaces 102(1) and 102(2) may also be forced to extend and/or stretch outward together with the set of mechanical amplifiers 108(1) and 108(2).

In some examples, actuation controller 210 may direct and/or feed an oscillated signal to actuator layer 106 at a certain frequency. In such examples, the frequency of the oscillated signal may control and/or dictate the position and/or state of actuator layer 106 and/or electric actuator assembly 104. Additionally or alternatively, the frequency of the oscillated signal may control and/or dictate the frequency at which touch-simulation apparatus 100 expands and contracts.

Figure 4:
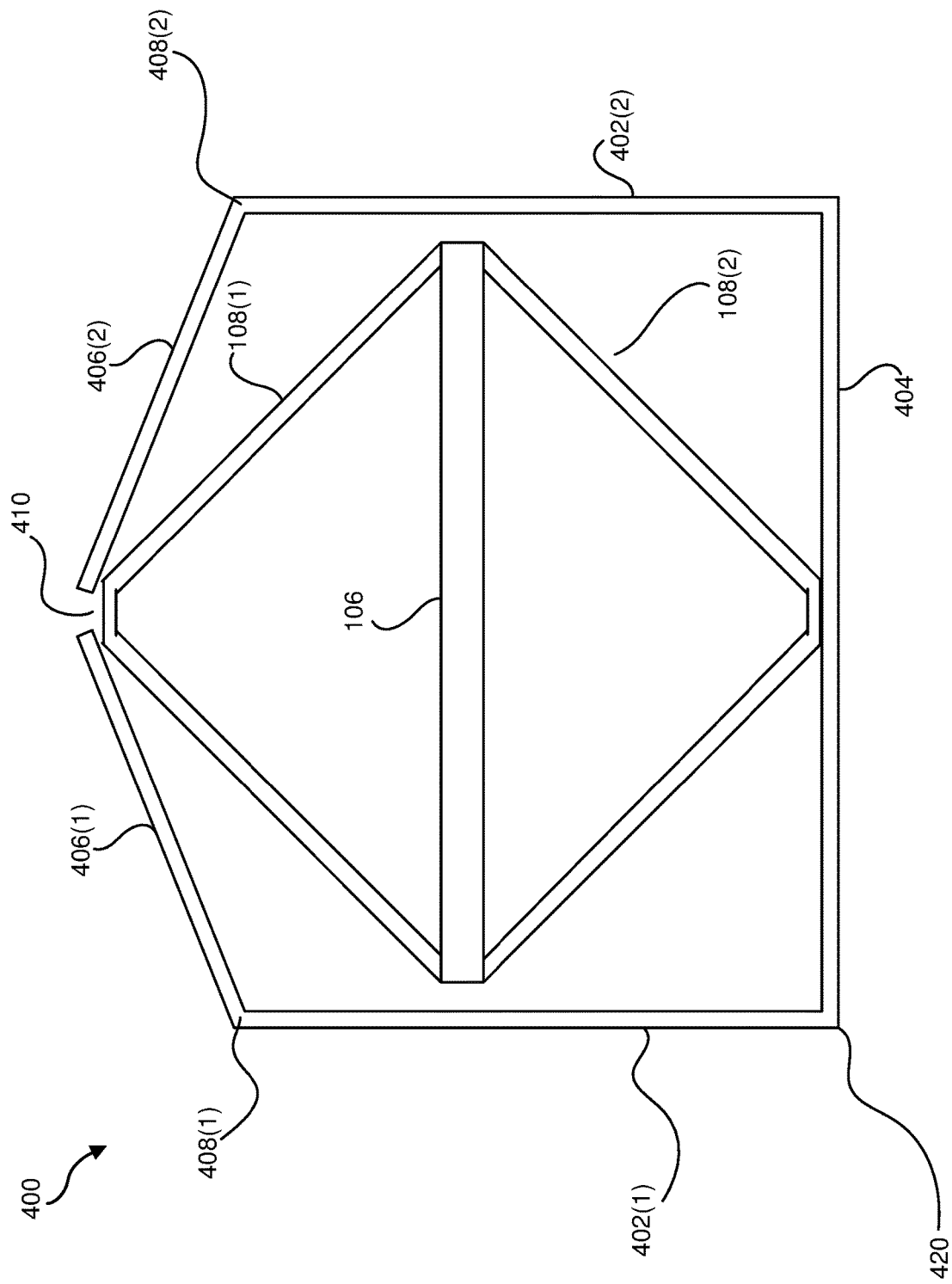
FIG. 4 is an illustration of an exemplary touch-simulation apparatus that may be used in connection with embodiments of this disclosure.
Figure 5:
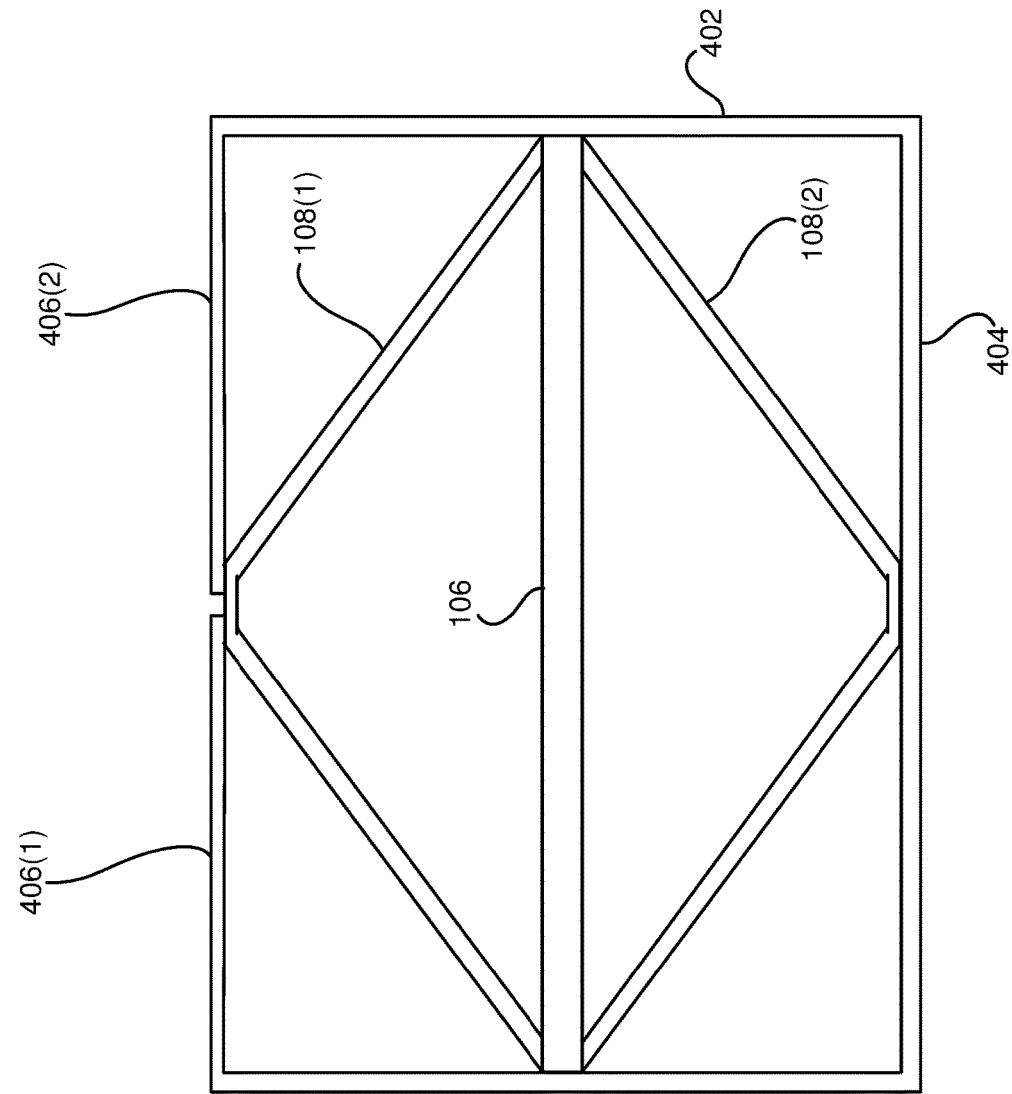
FIG. 5 is an illustration of an exemplary touch-simulation apparatus that may be used in connection with embodiments of this disclosure.

FIGS. 4 and 5 illustrate exemplary touch-simulation apparatuses 400 and 500, respectively, capable of simulating touch for a user via actuator-based haptic feedback. As illustrated in FIGS. 4 and 5, exemplary touch-simulation apparatuses 400 and 500 may include and/or represent electric actuator assembly 104 positioned and/or placed within a box enclosure 420. In some examples, box enclosure 420 may include and/or represent a bottom side 404, a top side, and side walls 402(1) and 402(2). In one example, the top side of box enclosure 420 may include and/or represent a set of casement flaps 406(1) and 406(2) that form and/or produce an opening 410. In this example, the set of casement flaps 406(1) and 406(2) may be hinged to side walls 402(1) and 402(2), respectively. For example, box enclosure 420 may include and/or incorporate hinges 408(1) and 408(2) that movably and/or rotatably secure, attach, and/or secure casement flaps 406(1) and 406(2) to side walls 402(1) and 402(2), respectively.

In one example, the top side of box enclosure 420 may be dimensioned for physical contact with the user's skin to simulate and/or produce a touch sensation for the user by opening and/or closing casement flaps 406(1) and 406(2) in connection with an artificial reality system. In this example, the opening and/or closing of casement flaps 406(1) and 406(2) may impart and/or simulate a touching or tapping pattern and/or sequence that coincides with certain content presented by and/or running on the artificial reality system.

In one example, actuation controller 210 (not necessarily illustrated in FIGS. 4 and 5) may actuate, activate, and/or deactivate actuator layer 106 of electric actuator assembly 104 within box enclosure 420. For example, actuation controller 210 may direct and/or cause actuator layer 106 to contract and/or shrink within box enclosure 420. In this example, and as illustrated in FIG. 4, the contraction and/or shrinkage of actuator layer 106 may cause and/or force the set of mechanical amplifiers 108(1) and 108(2) to extend and/or amplify outward from actuator layer 106 within box enclosure 420. As a result, the set of casement flaps 406(1) and 406(2) in FIG. 4 may also be forced to extend and/or stretch outward together with the set of mechanical amplifiers 108(1) and 108(2). In other words, as the set of mechanical amplifiers 108(1) and 108(2) extend and/or amplify outward from actuator layer 106 within box enclosure 420, electric actuator assembly 104 may effectively push up and/or open the set of casement flaps 406(1) and 406(2) on the top side of box enclosure 420.

As another example, actuation controller 210 may direct and/or cause actuator layer 106 to expand and/or grow within box enclosure 420. In this example, and as illustrated in FIG. 5, the expansion and/or growth of actuator layer 106 may cause and/or force the set of mechanical amplifiers 108(1) and 108(2) to contract and/or retract inward toward actuator layer 106 within box enclosure 420. As a result, the set of casement flaps 406(1) and 406(2) in FIG. 5 may also be forced to contract and/or retract inward together with the set of mechanical amplifiers 108(1) and 108(2). In other words, as the set of mechanical amplifiers 108(1) and 108(2) contract and/or retract inward toward actuator layer 106 within box enclosure 420, electric actuator assembly 104 may effectively bring down and/or close the set of casement flaps 406(1) and 406(2) on the top side of box enclosure 420.

In some examples, touch-simulation apparatuses 400 and 500 may each incorporate and/or involve silicone molding. For example, touch-simulation apparatuses 400 and 500 may each include silicone molding that partially or fully wraps around and/or encompasses electric actuator assembly 104. In one example, touch-simulation apparatuses 400 and 500 may further include a metal plate coupled to the top of electric actuator assembly 104 by the silicone molding and/or another metal plate coupled to the bottom of electric actuator assembly 104 by the silicone molding. In this example, the outer sides of the metal plates may be exposed such that the silicone molding remains between the inner sides of the metal plates and electrical actuator assembly 104. The silicone molding may provide mechanical structural stability to electrical actuator assembly 104 and/or touch-simulation apparatuses 400 and 500. Additionally or alternatively, the silicone molding may serve and/or act as a spring.

In another example, the outer side of the top metal plate may be covered by silicone molding while the outer side of the bottom metal plate remains exposed. In this example, the silicone molding on the outer side of the top metal plate may be able to make contact with the user's skin.

Figure 6:
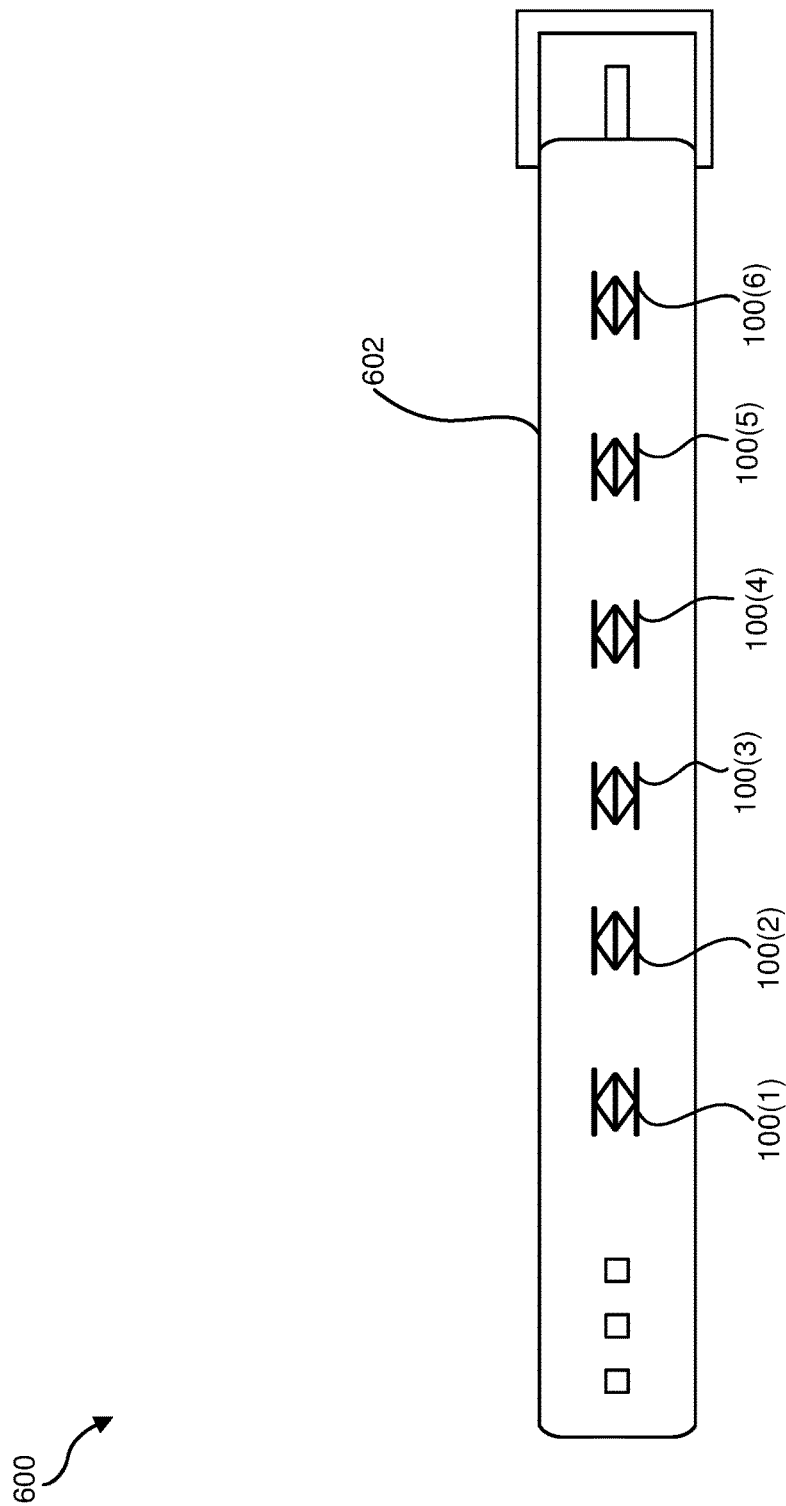
FIG. 6 is an illustration of an exemplary wearable device that incorporates a set of touch-simulation apparatuses that may be used in connection with embodiments of this disclosure.

FIG. 6 illustrate an exemplary wearable device 600 capable of simulating touch for a user via actuator-based haptic feedback. As illustrated in FIG. 6, exemplary wearable device 600 may include and/or represent a wristband 602 dimensioned to be donned by a user of an artificial reality system. In one example, exemplary wearable device 600 may include and/or incorporate a set of touch-simulation apparatuses 100(1), 100(2), 100(3), 100(4), 100(5), and 100(6) that facilitate imparting and/or simulating touch sensations for the user. In this example, the user may fasten and/or secure wearable device 600 to one of his or her wrists via wristband 602.

In some examples, wearable device 600 may deliver and/or apply certain electric currents and/or electrical signals to touch-simulation apparatuses 100(1)-(6). By doing so, wearable device 600 may be able to impart and/or simulate a touching or tapping pattern coinciding with certain content presented by and/or running on the artificial reality system. More specifically, wearable device 600 may be able to coordinate and/or orchestrate certain touching and/or tapping patterns and/or sequences around or across the user's wrist to simulate specific movements and/or actions for the user. Such movements and/or actions may coincide with and/or correspond to certain content presented by and/or running on the user's artificial reality system.

Figure 7:
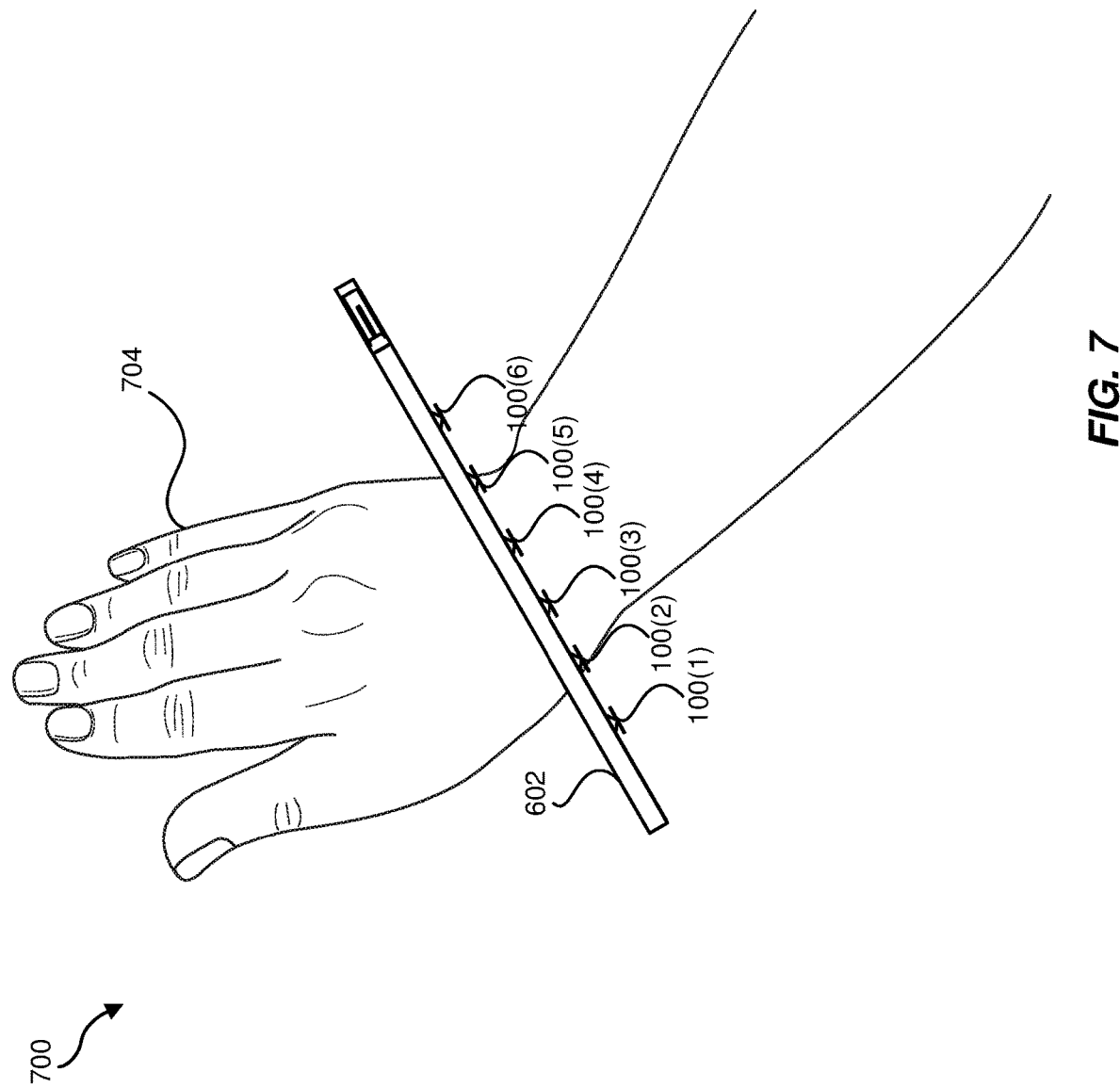
FIG. 7 is an illustration of an exemplary implementation of a wearable device that incorporates a set of touch-simulation apparatuses according to embodiments of this disclosure.
Figure 8:
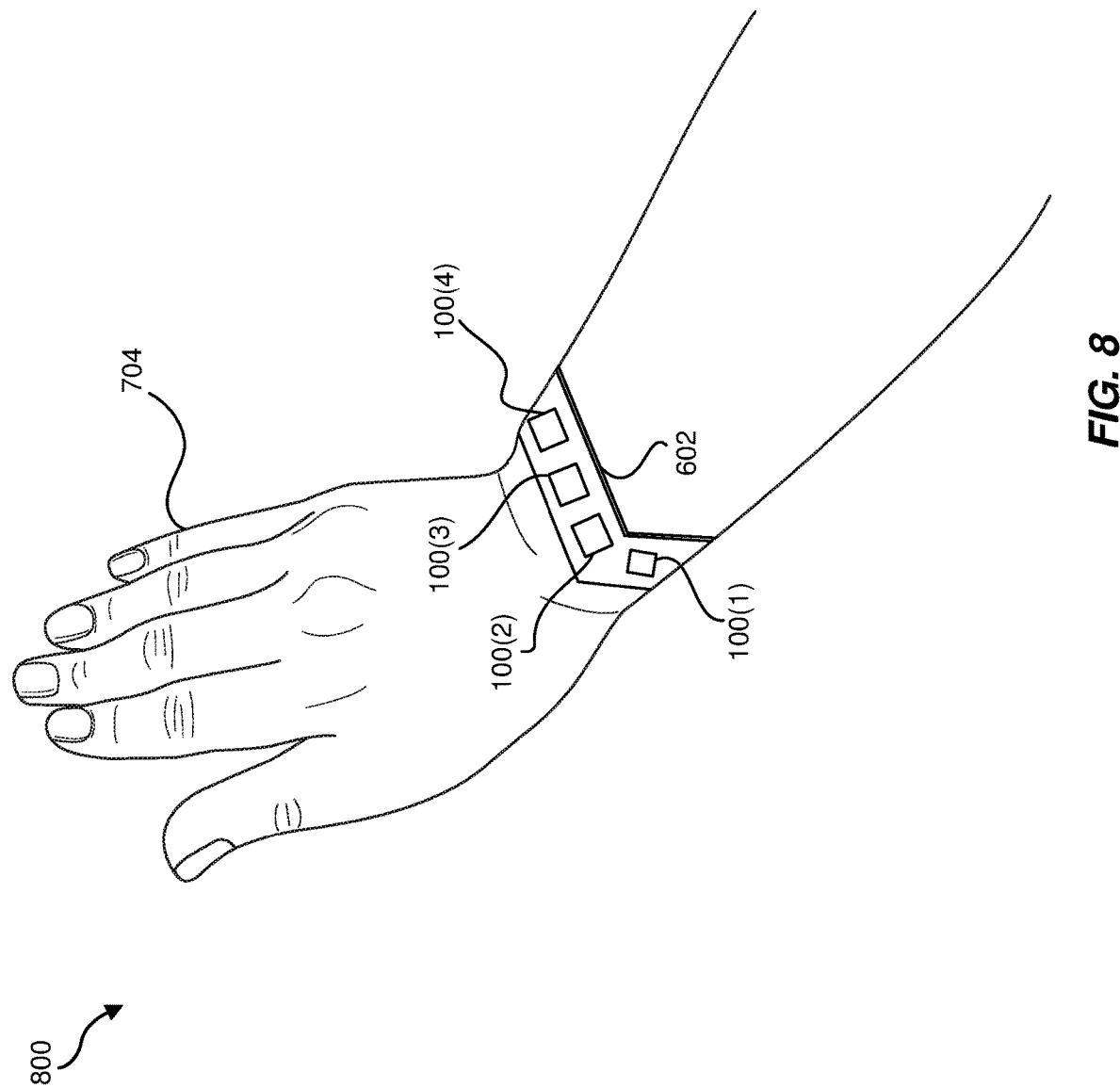
FIG. 8 is an illustration of an exemplary implementation of a wearable device that incorporates a set of touch-simulation apparatuses according to embodiments of this disclosure.

FIGS. 7 and 8 illustrates exemplary implementations 700 and 800 in which a user 704 dons, operates, and/or deploys wearable device 600 from FIG. 6. As illustrated in FIG. 7, exemplary implementation 700 may involve coupling and/or securing wearable device 600 to the user's wrist by wrapping wristband 602 around the user's wrist and then fastening wristband 602 together. As wearable device 600 is coupled and/or secured to the user's wrist, touch-simulation apparatuses 100(1)-(6) may press against the user's wrist to facilitate actuator-based haptic feedback to the user.

As illustrated in FIG. 8, exemplary implementation 800 may involve wearing and/or donning wearable device 600 on the user's wrist. When worn and/or donned on the user's wrist, wearable device 600 may be able to impart and/or simulate certain touching or tapping patterns and/or sequences for the user via touch-simulation apparatuses 100(1)-(6).

Figure 9:
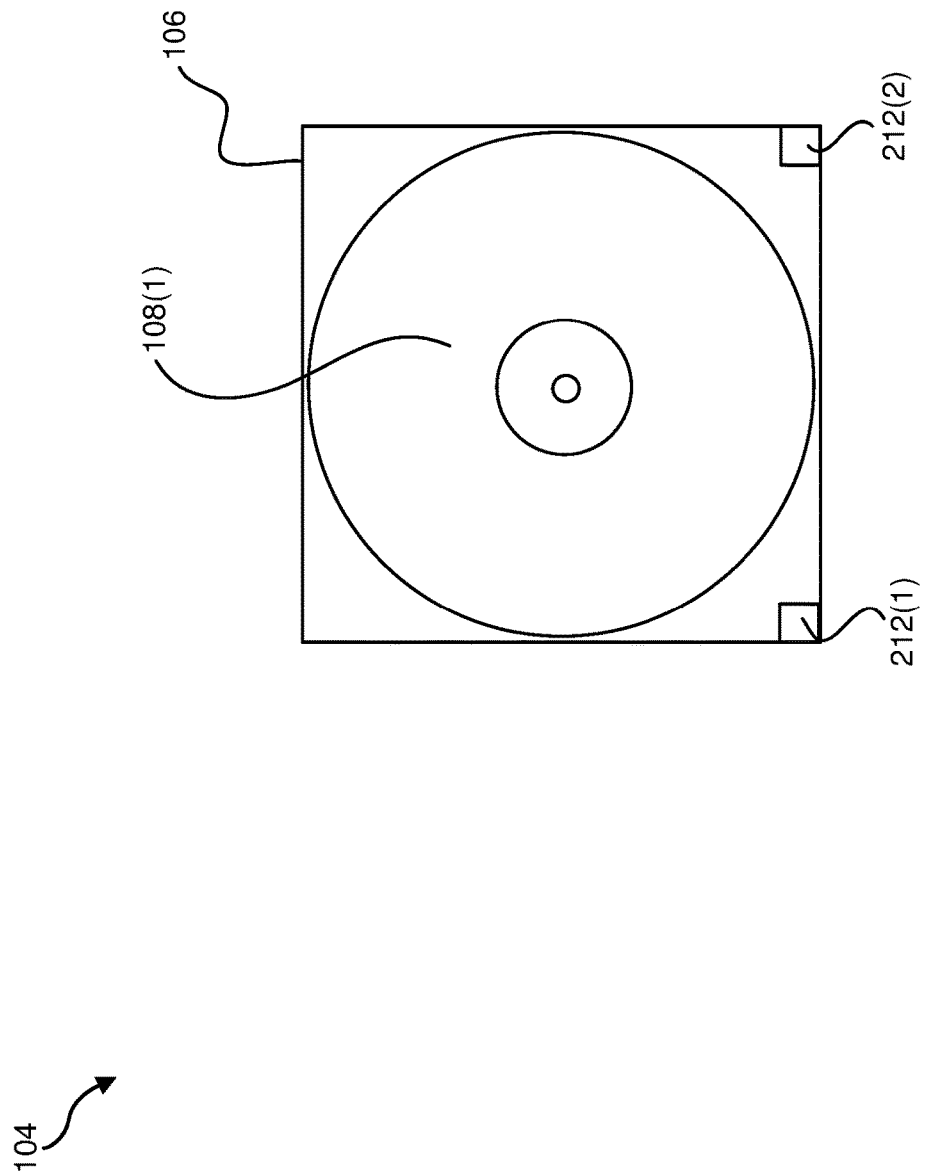
FIG. 9 is an illustration of a top-down view of an exemplary electric actuator assembly that facilitates touch simulation according to embodiments of this disclosure.

FIG. 9 is an illustration of a top-down view of exemplary electric actuator assembly 104 that facilitates actuator-based touch simulation. As illustrated in FIG. 9, electric actuator assembly 104 may include and/or incorporate a rectangular-shaped actuator layer 106 with a set of conductive contacts serving as electrical leads 212(1) and 212(2). In one example, electric actuator assembly 104 may include and/or incorporate a cymbal-shaped mechanical amplifier 108(1). In this example, mechanical amplifier 108(1) may be rounded and/or concave.

Figure 10:
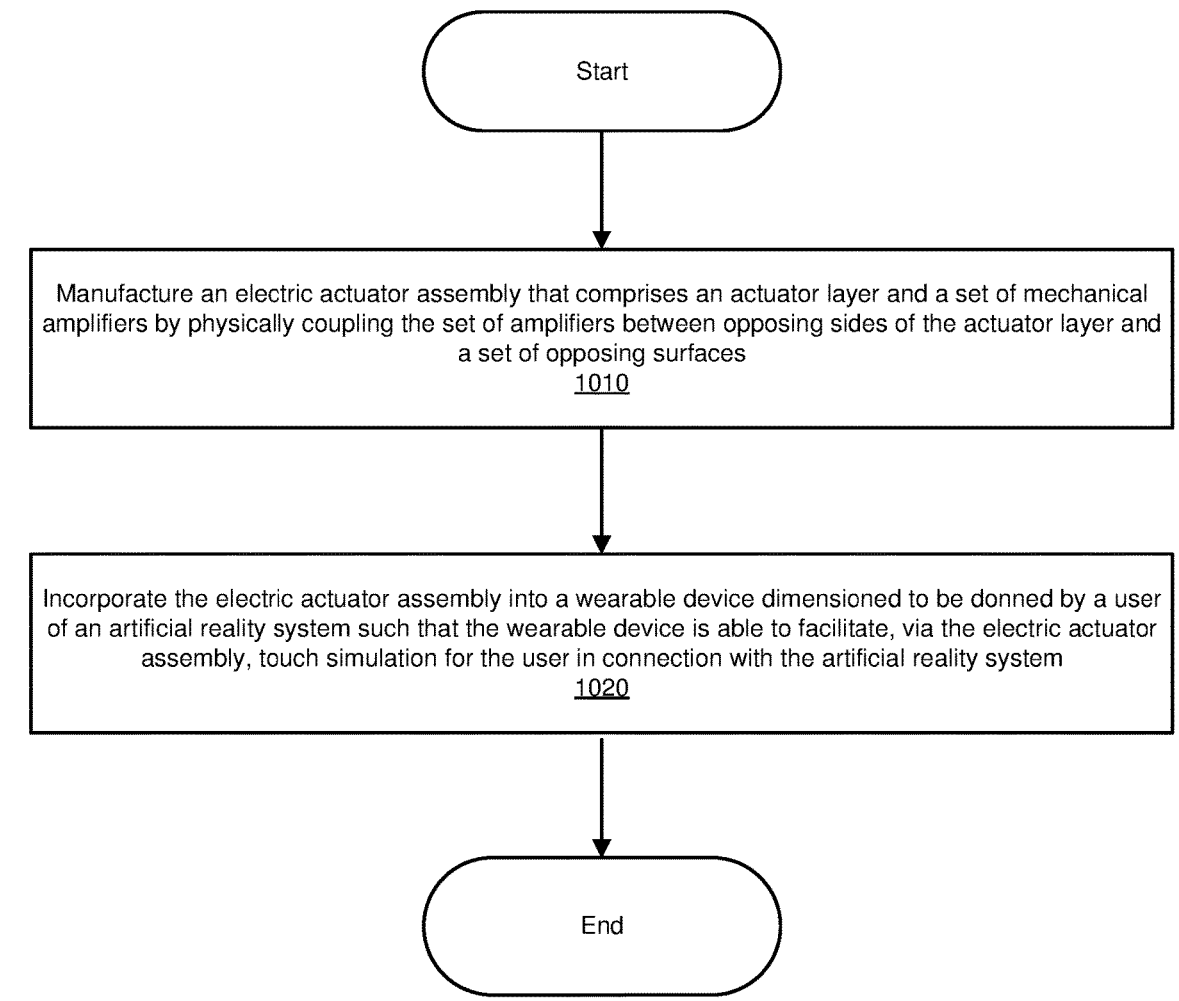
FIG. 10 is a flowchart of an exemplary method for actuator-based touch simulation.

FIG. 10 is a flow diagram of an exemplary method 1000 for actuator-based touch simulation. The steps shown in FIG. 10 may be performed as part of a manufacturing and/or assembling process for a touch-simulation apparatus. Additionally or alternatively, the steps shown in FIG. 10 may also incorporate and/or involve various sub-steps and/or variations consistent with the descriptions provided above in connection with FIGS. 1-9.

As illustrated in FIG. 10, method 1000 may include a step 1010 in which a touch-simulation apparatus is manufactured for application within a wearable device. In one example, a wearable manufacturer or subcontractor may manufacture, construct, and/or assemble an electric actuator assembly 104 that includes an actuator layer and a set of mechanical amplifiers. For example, the wearable manufacturer or subcontractor may physically couple, attach, and/or adhere the set of mechanical amplifiers between the actuator layer and a set of opposing surfaces. In one example, the set of opposing surfaces may include and/or represent a plurality of plates. In another example, the set of opposing surfaces may include and/or represent different sides of an openable box enclosure.

As illustrated in FIG. 10, method 1000 may also include a step 1020 in which the touch-simulation apparatus is incorporated into a wearable device for use in connection with an artificial reality system. In one example, the wearable manufacturer or subcontractor may incorporate, deploy, and/or apply the touch-simulation apparatus in a wearable device. For example, the wearable manufacturer or subcontractor may physically couple, attach, and/or adhere the electric actuator assembly to a wristband dimensioned to be donned by a user of an artificial reality system. As a result, the wristband may be able to facilitate, via the electric actuator assembly, touch simulation and/or sensation for the user in connection with the artificial reality system.

As explained above in connection with FIGS. 1-10, one or more touch-simulation apparatuses may be able to transfer and/or impart discernible or meaningful haptic feedback to a user as part of a wearable device. In one example, these touch-simulation apparatuses may each fit within a relatively small and/or compact footprint. For example, wristband may incorporate and/or deploy a series of these compact touch-simulation apparatuses that span around and/or across a user's wrist. In this example, each of these compact touch-simulation apparatuses may include a set of opposing surfaces (such as opposing plates and/or different sides of a box enclosure) and an electric actuator assembly coupled between the set of opposing surfaces.

In one example, the wristband may deliver and/or apply certain electric currents and/or electrical signals to the series of touch-simulation apparatuses. By doing so, the wristband may be able to impart and/or simulate a touching or tapping pattern and/or sequence that coincides with certain content presented by and/or running on the artificial reality system. For example, the wristband may be able to coordinate and/or orchestrate certain touching or tapping patterns and/or sequences around or across the user's wrist to simulate specific movements and/or actions for the user. Such movements and/or actions may coincide with and/or correspond to certain content presented by and/or running on the user's artificial reality system.

EXAMPLE EMBODIMENTS

Example 1: A touch-simulation apparatus includes (1) a set of opposing surfaces and (2) an electric actuator assembly coupled between the set of opposing surfaces, wherein (A) the electric actuator assembly includes an actuator layer and (B) a set of mechanical amplifiers coupled between opposing sides of the actuator layer and the set of opposing surfaces.

Example 2: The touch-simulation of Example 1, wherein the set of opposing surfaces may include (1) a set of opposing plates or (2) a plate and a surface of a wearable band.

Example 3: The touch-simulation apparatus of Example 1, wherein at least one of the mechanical amplifiers and at least one of the opposing surfaces are coupled to each other by an adhesive.

Example 4: The touch-simulation apparatus of Example 1, further comprising one or more electrical leads coupled between the electric actuator assembly and an actuation controller, wherein the electrical leads deliver electric current from the actuation controller to the electric actuator assembly for actuating the actuator layer.

Example 5: The touch-simulation apparatus of Example 4, wherein actuating the actuator layer includes at least one of (1) expanding the actuator layer to retract the set of mechanical amplifiers and the set of opposing surfaces inward toward the actuator layer or (2) contracting the actuator layer to extend the set of mechanical amplifiers and the set of opposing surfaces outward from the actuator layer.

Example 6: The touch-simulation apparatus of Example 1, wherein (1) one of the opposing surfaces is coupled to a wearable band dimensioned to be donned by a user of an artificial reality system and (2) another one of the opposing surfaces is dimensioned for physical contact with skin of the user to facilitate touch simulation for the user in connection with the artificial reality system.

Example 7: The touch-simulation apparatus of Example 1, wherein the set of opposing surfaces includes (1) a bottom side of a box enclosure coupled to a wearable band dimensioned to be donned by a user of an artificial reality system and (2) a top side of the box enclosure that includes a set of casement flaps that (A) are each hinged to a wall of the box enclosure and (B) form an opening.

Example 8: The touch-simulation apparatus of Example 7, wherein the top side of the box enclosure is dimensioned for physical contact with skin of the user to facilitate touch simulation for the user by opening or closing the casement flaps in connection with the artificial reality system.

Example 9: The touch-simulation apparatus of Example 1, wherein the actuator layer comprises a piezoelectric ceramic.

Example 10: The touch-simulation apparatus of Example 1, wherein at least one of the opposing surfaces is composed of a plastic material.

Example 11: The touch-simulation apparatus of Example 1, wherein the actuator layer is positioned parallel to the set of opposing surfaces.

Example 12: The touch-simulation apparatus of Example 1, wherein at least one of the mechanical amplifiers is formed into a cymbal shape.

Example 13: The touch-simulation apparatus of Example 1, further comprising (1) another set of opposing surfaces and (2) another electric actuator assembly coupled between the another set of opposing surfaces, wherein the another electric actuator assembly includes (A) another actuator layer and (B) another set of mechanical amplifiers coupled between opposing sides of the another actuator layer and the another set of opposing surfaces.

Example 14: A wearable device includes (1) a wearable band dimensioned to be donned by a user of an artificial reality system and (2) at least one touch-simulation device coupled to the wearable band, wherein the touch-simulation device includes (A) a set of opposing surfaces and (B) an electric actuator assembly coupled between the set of opposing surfaces, wherein the electric actuator assembly includes (I) an actuator layer and (II) a set of mechanical amplifiers coupled between opposing sides of the actuator layer and the set of opposing surfaces.

Example 15: The wearable device of Example 14, wherein the set of opposing surfaces comprises at least one of (1) a set of opposing plates or (2) a plate and a surface of the wearable band.

Example 16: The wearable device of Example 14, wherein at least one of the mechanical amplifiers and at least one of the opposing surfaces are coupled to each other by an adhesive.

Example 17: The wearable device of Example 14, further comprising one or more electrical leads coupled between the electric actuator assembly and an actuation controller, wherein the electrical leads deliver electric current from the actuation controller to the electric actuator assembly for actuating the actuator layer.

Example 18: The wearable device of Example 17, wherein actuating the actuator layer includes at least one of (1) expanding the actuator layer to retract the set of mechanical amplifiers and the set of opposing surfaces inward toward the actuator layer or (2) contracting the actuator layer to extend the set of mechanical amplifiers and the set of opposing surfaces outward from the actuator layer.

Example 19: The wearable device of Example 14, wherein (1) one of the opposing surfaces is coupled to a wearable band dimensioned to be donned by a user of an artificial reality system and (2) another one of the opposing surfaces is dimensioned for physical contact with skin of the user to facilitate touch simulation for the user in connection with the artificial reality system.

Example 20: A method includes (1) manufacturing an electric actuator assembly that comprises an actuator layer and a set of mechanical amplifiers by physically coupling the set of mechanical amplifiers between opposing sides of the actuator layer and a set of opposing surfaces and (2) incorporating the electric actuator assembly into a wearable device dimensioned to be donned by a user of an artificial reality system such that the wearable device is able to facilitate, via the electric actuator assembly, touch simulation for the user in connection with the artificial reality system.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Embodiments of the present disclosure may include or be implemented in conjunction with various types of artificial reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial reality systems may be implemented in a variety of different form factors and configurations. Some artificial reality systems may be designed to work without near-eye displays (NEDs), an example of which is augmented reality system 1100 in FIG. 11. Other artificial reality systems may include an NED that also provides visibility into the real world (e.g., augmented reality system 1200 in FIG. 12) or that visually immerses a user in an artificial reality (e.g., virtual reality system 1300 in FIG. 13). While some artificial reality devices may be self-contained systems, other artificial reality devices may communicate and/or coordinate with external devices to provide an artificial reality experience to a user. Examples of such external devices include handheld controllers, mobile devices, desktop computers, devices worn by a user, devices worn by one or more other users, and/or any other suitable external system.

Figure 11:
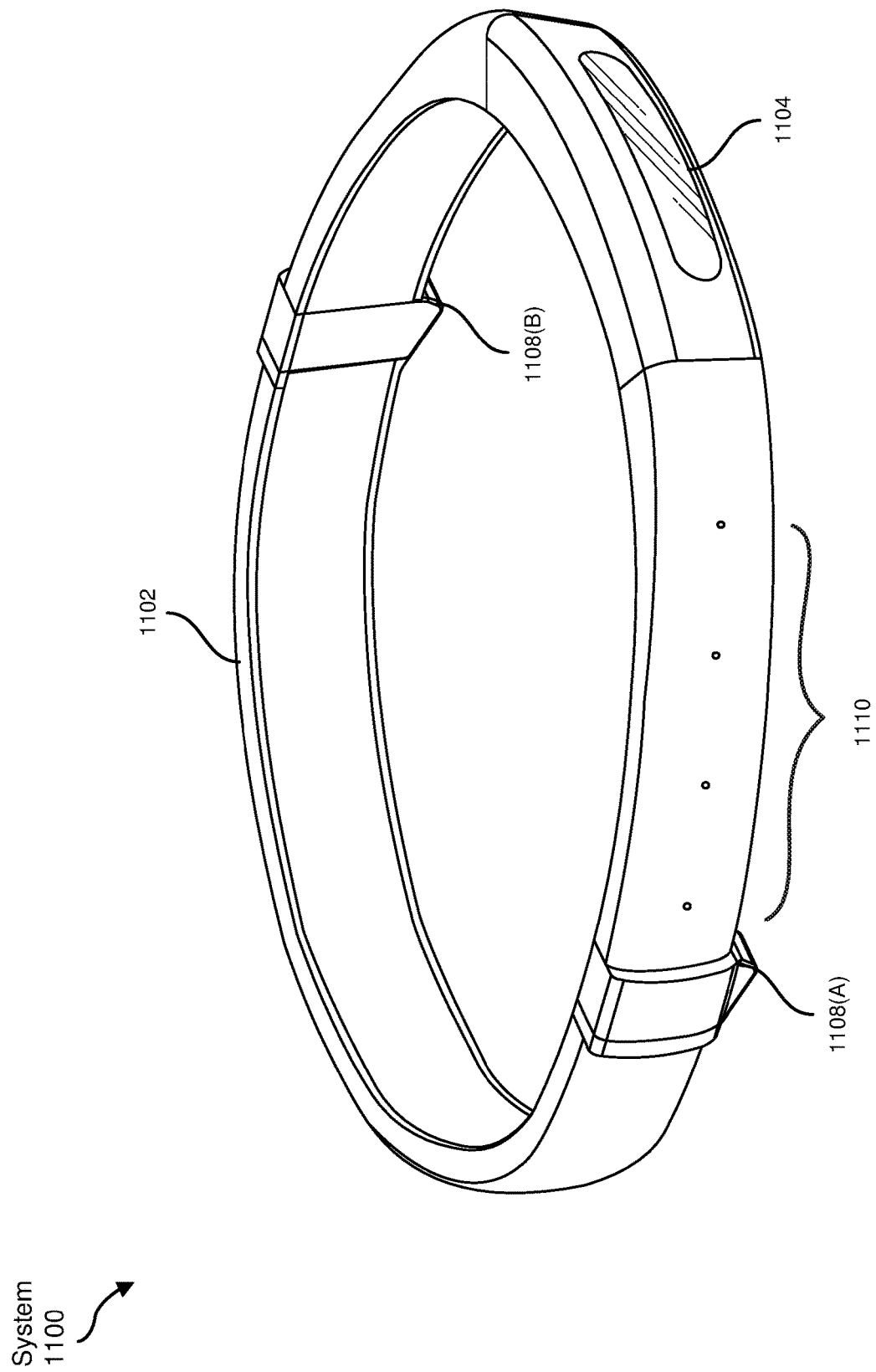
FIG. 11 is an illustration of an exemplary artificial reality headband that may be used in connection with embodiments of this disclosure.

Turning to FIG. 11, augmented reality system 1100 generally represents a wearable device dimensioned to fit about a body part (e.g., a head) of a user. As shown in FIG. 11, system 1100 may include a frame 1102 and a camera assembly 1104 that is coupled to frame 1102 and configured to gather information about a local environment by observing the local environment. Augmented reality system 1100 may also include one or more audio devices, such as output audio transducers 1108(A) and 1108(B) and input audio transducers 1110. Output audio transducers 1108(A) and 1108(B) may provide audio feedback and/or content to a user, and input audio transducers 1110 may capture audio in a user's environment.

As shown, augmented reality system 1100 may not necessarily include an NED positioned in front of a user's eyes. Augmented reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented reality system 1100 may not include an NED, augmented reality system 1100 may include other types of screens or visual feedback devices (e.g., a display screen integrated into a side of frame 1102).

Figure 12:
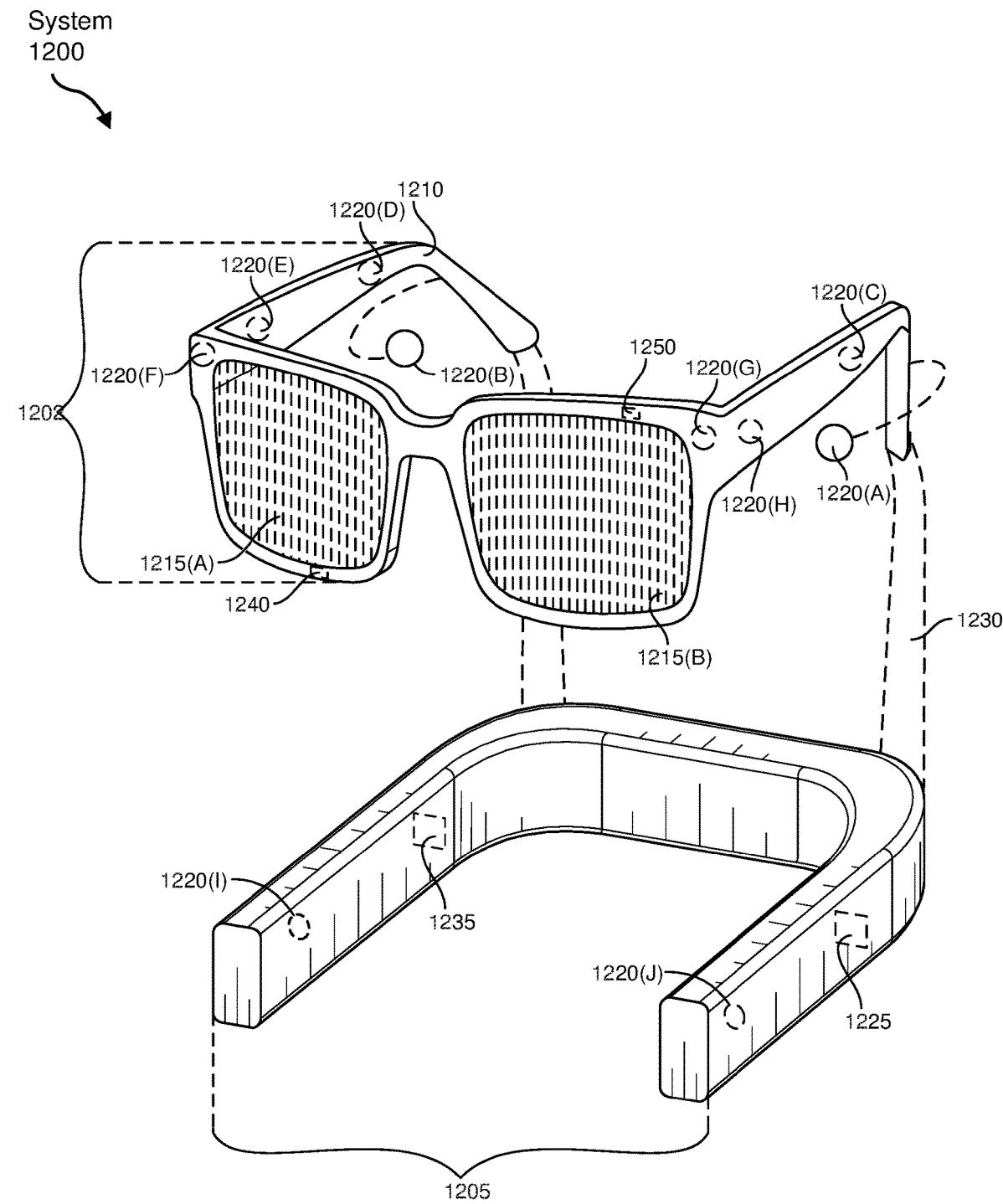
FIG. 12 is an illustration of exemplary augmented reality glasses that may be used in connection with embodiments of this disclosure.

The embodiments discussed in this disclosure may also be implemented in augmented reality systems that include one or more NEDs. For example, as shown in FIG. 12, augmented reality system 1200 may include an eyewear device 1202 with a frame 1210 configured to hold a left display device 1215(A) and a right display device 1215(B) in front of a user's eyes. Display devices 1215(A) and 1215(B) may act together or independently to present an image or series of images to a user. While augmented reality system 1200 includes two displays, embodiments of this disclosure may be implemented in augmented reality systems with a single NED or more than two NEDs.

In some embodiments, augmented reality system 1200 may include one or more sensors, such as sensor 1240. Sensor 1240 may generate measurement signals in response to motion of augmented reality system 1200 and may be located on substantially any portion of frame 1210. Sensor 1240 may represent a position sensor, an inertial measurement unit (IMU), a depth camera assembly, or any combination thereof. In some embodiments, augmented reality system 1200 may or may not include sensor 1240 or may include more than one sensor. In embodiments in which sensor 1240 includes an IMU, the IMU may generate calibration data based on measurement signals from sensor 1240. Examples of sensor 1240 may include, without limitation, accelerometers, gyroscopes, magnetometers, other suitable types of sensors that detect motion, sensors used for error correction of the IMU, or some combination thereof.

Augmented reality system 1200 may also include a microphone array with a plurality of acoustic transducers 1220(A)-1220(J), referred to collectively as acoustic transducers 1220. Acoustic transducers 1220 may be transducers that detect air pressure variations induced by sound waves. Each acoustic transducer 1220 may be configured to detect sound and convert the detected sound into an electronic format (e.g., an analog or digital format). The microphone array in FIG. 2 may include, for example, ten acoustic transducers: 1220(A) and 1220(B), which may be designed to be placed inside a corresponding ear of the user, acoustic transducers 1220(C), 1220(D), 1220(E), 1220(F), 1220(G), and 1220(H), which may be positioned at various locations on frame 1210, and/or acoustic transducers 1220(1) and 1220(J), which may be positioned on a corresponding neckband 1205.

In some embodiments, one or more of acoustic transducers 1220(A)-(F) may be used as output transducers (e.g., speakers). For example, acoustic transducers 1220(A) and/or 1220(B) may be earbuds or any other suitable type of headphone or speaker.

The configuration of acoustic transducers 1220 of the microphone array may vary. While augmented reality system 1200 is shown in FIG. 12 as having ten acoustic transducers 1220, the number of acoustic transducers 1220 may be greater or less than ten. In some embodiments, using higher numbers of acoustic transducers 1220 may increase the amount of audio information collected and/or the sensitivity and accuracy of the audio information. In contrast, using a lower number of acoustic transducers 1220 may decrease the computing power required by an associated controller 1250 to process the collected audio information. In addition, the position of each acoustic transducer 1220 of the microphone array may vary. For example, the position of an acoustic transducer 1220 may include a defined position on the user, a defined coordinate on frame 1210, an orientation associated with each acoustic transducer 1220, or some combination thereof.

Acoustic transducers 1220(A) and 1220(B) may be positioned on different parts of the user's ear, such as behind the pinna or within the auricle or fossa. Or, there may be additional acoustic transducers 1220 on or surrounding the ear in addition to acoustic transducers 1220 inside the ear canal. Having an acoustic transducer 1220 positioned next to an ear canal of a user may enable the microphone array to collect information on how sounds arrive at the ear canal. By positioning at least two of acoustic transducers 1220 on either side of a user's head (e.g., as binaural microphones), augmented reality device 1200 may simulate binaural hearing and capture a 3D stereo sound field around about a user's head. In some embodiments, acoustic transducers 1220(A) and 1220(B) may be connected to augmented reality system 1200 via a wired connection 1230, and in other embodiments, acoustic transducers 1220(A) and 1220(B) may be connected to augmented reality system 1200 via a wireless connection (e.g., a Bluetooth connection). In still other embodiments, acoustic transducers 1220(A) and 1220(B) may not be used at all in conjunction with augmented reality system 1200.

Acoustic transducers 1220 on frame 1210 may be positioned along the length of the temples, across the bridge, above or below display devices 1215(A) and 1215(B), or some combination thereof. Acoustic transducers 1220 may be oriented such that the microphone array is able to detect sounds in a wide range of directions surrounding the user wearing the augmented reality system 1200. In some embodiments, an optimization process may be performed during manufacturing of augmented reality system 1200 to determine relative positioning of each acoustic transducer 1220 in the microphone array.

In some examples, augmented reality system 1200 may include or be connected to an external device (e.g., a paired device), such as neckband 1205. Neckband 1205 generally represents any type or form of paired device. Thus, the following discussion of neckband 1205 may also apply to various other paired devices, such as charging cases, smart watches, smart phones, wrist bands, other wearable devices, hand-held controllers, tablet computers, laptop computers and other external compute devices, etc.

As shown, neckband 1205 may be coupled to eyewear device 1202 via one or more connectors. The connectors may be wired or wireless and may include electrical and/or non-electrical (e.g., structural) components. In some cases, eyewear device 1202 and neckband 1205 may operate independently without any wired or wireless connection between them. While FIG. 12 illustrates the components of eyewear device 1202 and neckband 1205 in example locations on eyewear device 1202 and neckband 1205, the components may be located elsewhere and/or distributed differently on eyewear device 1202 and/or neckband 1205. In some embodiments, the components of eyewear device 1202 and neckband 1205 may be located on one or more additional peripheral devices paired with eyewear device 1202, neckband 1205, or some combination thereof.

Pairing external devices, such as neckband 1205, with augmented reality eyewear devices may enable the eyewear devices to achieve the form factor of a pair of glasses while still providing sufficient battery and computation power for expanded capabilities. Some or all of the battery power, computational resources, and/or additional features of augmented reality system 1200 may be provided by a paired device or shared between a paired device and an eyewear device, thus reducing the weight, heat profile, and form factor of the eyewear device overall while still retaining desired functionality. For example, neckband 1205 may allow components that would otherwise be included on an eyewear device to be included in neckband 1205 since users may tolerate a heavier weight load on their shoulders than they would tolerate on their heads. Neckband 1205 may also have a larger surface area over which to diffuse and disperse heat to the ambient environment. Thus, neckband 1205 may allow for greater battery and computation capacity than might otherwise have been possible on a stand-alone eyewear device. Since weight carried in neckband 1205 may be less invasive to a user than weight carried in eyewear device 1202, a user may tolerate wearing a lighter eyewear device and carrying or wearing the paired device for greater lengths of time than a user would tolerate wearing a heavy stand-alone eyewear device, thereby enabling users to more fully incorporate artificial reality environments into their day-to-day activities.

Neckband 1205 may be communicatively coupled with eyewear device 1202 and/or to other devices. These other devices may provide certain functions (e.g., tracking, localizing, depth mapping, processing, storage, etc.) to augmented reality system 1200. In the embodiment of FIG. 12, neckband 1205 may include two acoustic transducers (e.g., 1220(1) and 1220(J)) that are part of the microphone array (or potentially form their own microphone subarray). Neckband 1205 may also include a controller 1225 and a power source 1235.

Acoustic transducers 1220(1) and 1220(J) of neckband 1205 may be configured to detect sound and convert the detected sound into an electronic format (analog or digital). In the embodiment of FIG. 12, acoustic transducers 1220(1) and 1220(J) may be positioned on neckband 1205, thereby increasing the distance between the neckband acoustic transducers 1220(1) and 1220(J) and other acoustic transducers 1220 positioned on eyewear device 1202. In some cases, increasing the distance between acoustic transducers 1220 of the microphone array may improve the accuracy of beamforming performed via the microphone array. For example, if a sound is detected by acoustic transducers 1220(C) and 1220(D) and the distance between acoustic transducers 1220(C) and 1220(D) is greater than, e.g., the distance between acoustic transducers 1220(D) and 1220(E), the determined source location of the detected sound may be more accurate than if the sound had been detected by acoustic transducers 1220(D) and 1220(E).

Controller 1225 of neckband 1205 may process information generated by the sensors on neckband 1205 and/or augmented reality system 1200. For example, controller 1225 may process information from the microphone array that describes sounds detected by the microphone array. For each detected sound, controller 1225 may perform a direction-of-arrival (DOA) estimation to estimate a direction from which the detected sound arrived at the microphone array. As the microphone array detects sounds, controller 1225 may populate an audio data set with the information. In embodiments in which augmented reality system 1200 includes an inertial measurement unit, controller 1225 may compute all inertial and spatial calculations from the IMU located on eyewear device 1202. A connector may convey information between augmented reality system 1200 and neckband 1205 and between augmented reality system 1200 and controller 1225. The information may be in the form of optical data, electrical data, wireless data, or any other transmittable data form. Moving the processing of information generated by augmented reality system 1200 to neckband 1205 may reduce weight and heat in eyewear device 1202, making it more comfortable to the user.

Power source 1235 in neckband 1205 may provide power to eyewear device 1202 and/or to neckband 1205. Power source 1235 may include, without limitation, lithium ion batteries, lithium-polymer batteries, primary lithium batteries, alkaline batteries, or any other form of power storage. In some cases, power source 1235 may be a wired power source. Including power source 1235 on neckband 1205 instead of on eyewear device 1202 may help better distribute the weight and heat generated by power source 1235.

As noted, some artificial reality systems may, instead of blending an artificial reality with actual reality, substantially replace one or more of a user's sensory perceptions of the real world with a virtual experience. One example of this type of system is a head-worn display system, such as virtual reality system 1300 in FIG. 13, that mostly or completely covers a user's field of view. Virtual reality system 1300 may include a front rigid body 1302 and a band 1304 shaped to fit around a user's head. Virtual reality system 1300 may also include output audio transducers 1306(A) and 1306(B). Furthermore, while not shown in FIG. 13, front rigid body 1302 may include one or more electronic elements, including one or more electronic displays, one or more inertial measurement units (IMUS), one or more tracking emitters or detectors, and/or any other suitable device or system for creating an artificial reality experience.

Artificial reality systems may include a variety of types of visual feedback mechanisms. For example, display devices in augmented reality system 1200 and/or virtual reality system 1300 may include one or more liquid crystal displays (LCDs), light emitting diode (LED) displays, organic LED (OLED) displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial reality systems may include one or more projection systems. For example, display devices in augmented reality system 1200 and/or virtual reality system 1300 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. Artificial reality systems may also be configured with any other suitable type or form of image projection system.

Artificial reality systems may also include various types of computer vision components and subsystems. For example, augmented reality system 1100, augmented reality system 1200, and/or virtual reality system 1300 may include one or more optical sensors, such as two-dimensional (2D) or 3D cameras, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

Artificial reality systems may also include one or more input and/or output audio transducers. In the examples shown in FIGS. 11 and 13, output audio transducers 1108(A), 1108(B), 1306(A), and 1306(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 1110 may include condenser microphones, dynamic microphones, ribbon microphones, and/or any other type or form of input transducer. In some embodiments, a single transducer may be used for both audio input and audio output.

Figure 13:
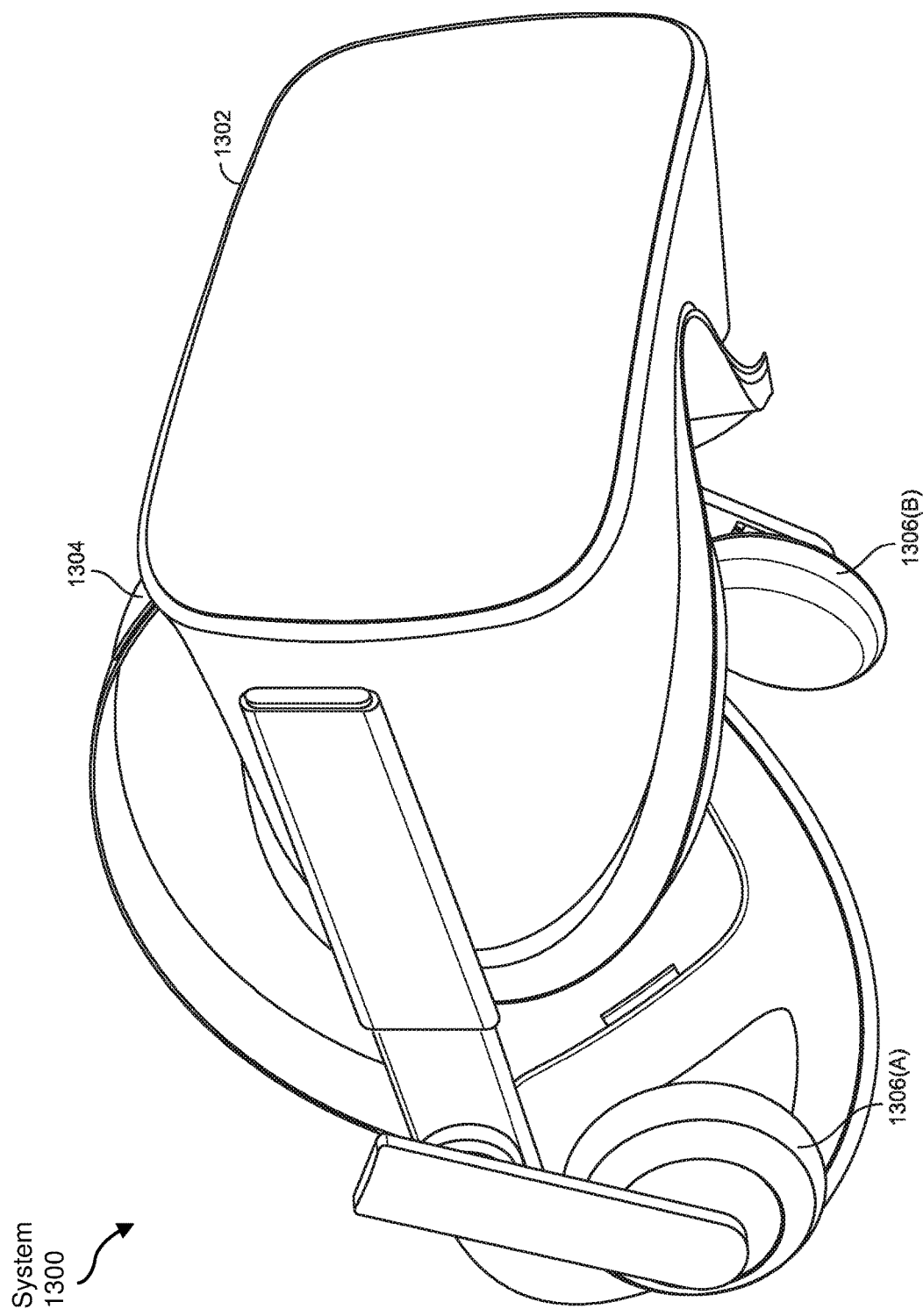
FIG. 13 is an illustration of an exemplary virtual reality headset that may be used in connection with embodiments of this disclosure.

While not shown in FIGS. 11-13, artificial reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial reality experience in one or more of these contexts and environments and/or in other contexts and environments.

As noted, artificial reality systems 1100, 1200, and 1300 may be used with a variety of other types of devices to provide a more compelling artificial reality experience. These devices may be haptic interfaces with transducers that provide haptic feedback and/or that collect haptic information about a user's interaction with an environment. The artificial reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 14:
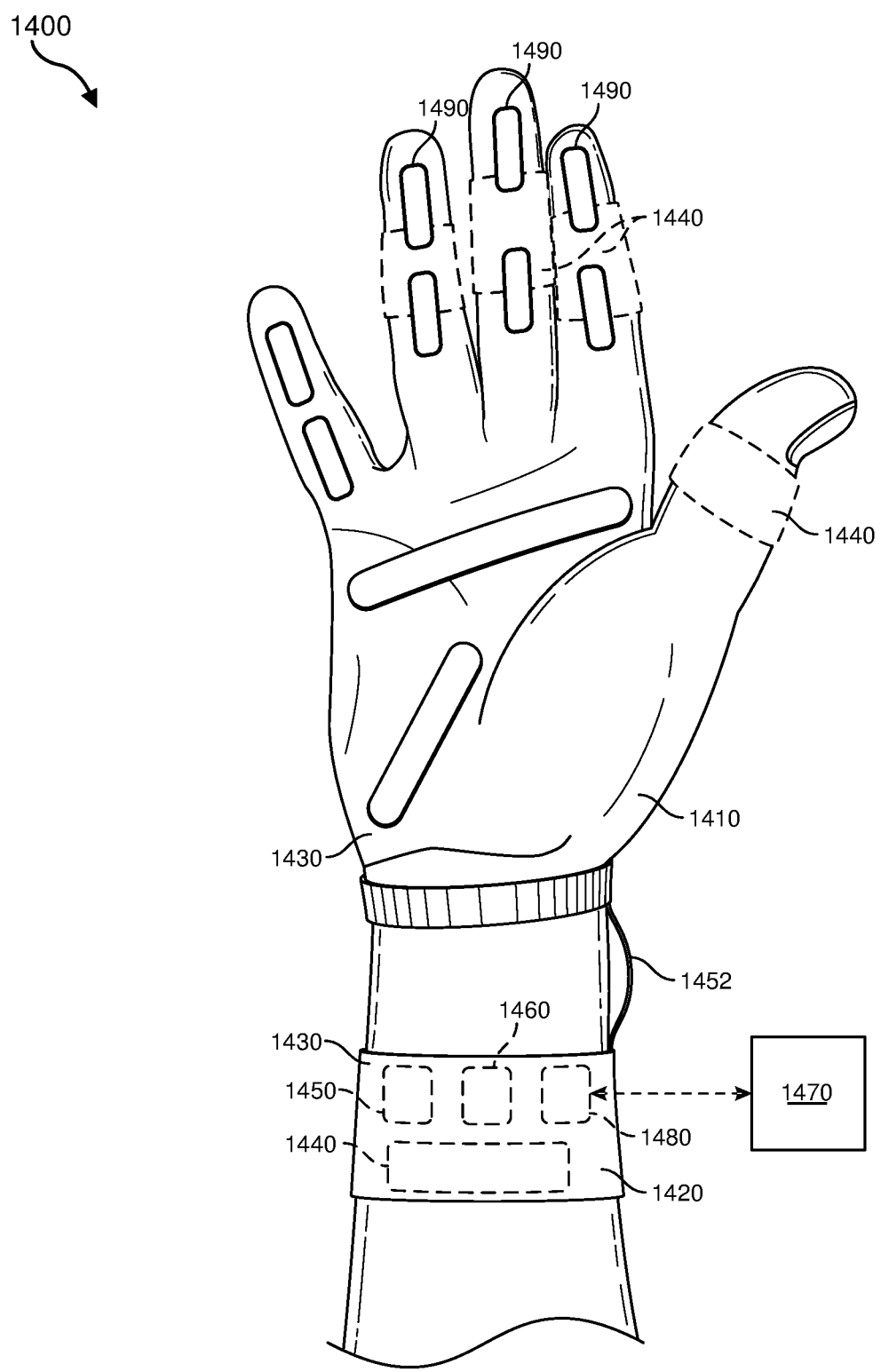
FIG. 14 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 14 illustrates a vibrotactile system 1400 in the form of a wearable glove (haptic device 1410) and wristband (haptic device 1420). Haptic device 1410 and haptic device 1420 are shown as examples of wearable devices that include a flexible, wearable textile material 1430 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, nonwoven fabric, leather, cloth, a flexible polymer material, composite materials, etc.

One or more vibrotactile devices 1440 may be positioned at least partially within one or more corresponding pockets formed in textile material 1430 of vibrotactile system 1400. Vibrotactile devices 1440 may be positioned in locations to provide a vibrating sensation (e.g., haptic feedback) to a user of vibrotactile system 1400. For example, vibrotactile devices 1440 may be positioned to be against the user's finger(s), thumb, or wrist, as shown in FIG. 14. Vibrotactile devices 1440 may, in some examples, be sufficiently flexible to conform to or bend with the user's corresponding body part(s).

A power source 1450 (e.g., a battery) for applying a voltage to the vibrotactile devices 1440 for activation thereof may be electrically coupled to vibrotactile devices 1440, such as via conductive wiring 1452. In some examples, each of vibrotactile devices 1440 may be independently electrically coupled to power source 1450 for individual activation. In some embodiments, a processor 1460 may be operatively coupled to power source 1450 and configured (e.g., programmed) to control activation of vibrotactile devices 1440.

Vibrotactile system 1400 may be implemented in a variety of ways. In some examples, vibrotactile system 1400 may be a standalone system with integral subsystems and components for operation independent of other devices and systems. As another example, vibrotactile system 1400 may be configured for interaction with another device or system 1470. For example, vibrotactile system 1400 may, in some examples, include a communications interface 1480 for receiving and/or sending signals to the other device or system 1470. The other device or system 1470 may be a mobile device, a gaming console, an artificial reality (e.g., virtual reality, augmented reality, mixed reality) device, a personal computer, a tablet computer, a network device (e.g., a modem, a router, etc.), a handheld controller, etc. Communications interface 1480 may enable communications between vibrotactile system 1400 and the other device or system 1470 via a wireless (e.g., Wi-Fi, Bluetooth, cellular, radio, etc.) link or a wired link. If present, communications interface 1480 may be in communication with processor 1460, such as to provide a signal to processor 1460 to activate or deactivate one or more of the vibrotactile devices 1440.

Vibrotactile system 1400 may optionally include other subsystems and components, such as touch-sensitive pads 1490, pressure sensors, motion sensors, position sensors, lighting elements, and/or user interface elements (e.g., an on/off button, a vibration control element, etc.). During use, vibrotactile devices 1440 may be configured to be activated for a variety of different reasons, such as in response to the user's interaction with user interface elements, a signal from the motion or position sensors, a signal from the touch-sensitive pads 1490, a signal from the pressure sensors, a signal from the other device or system 1470, etc.

Although power source 1450, processor 1460, and communications interface 1480 are illustrated in FIG. 14 as being positioned in haptic device 1420, the present disclosure is not so limited. For example, one or more of power source 1450, processor 1460, or communications interface 1480 may be positioned within haptic device 1410 or within another wearable textile.

Figure 15:
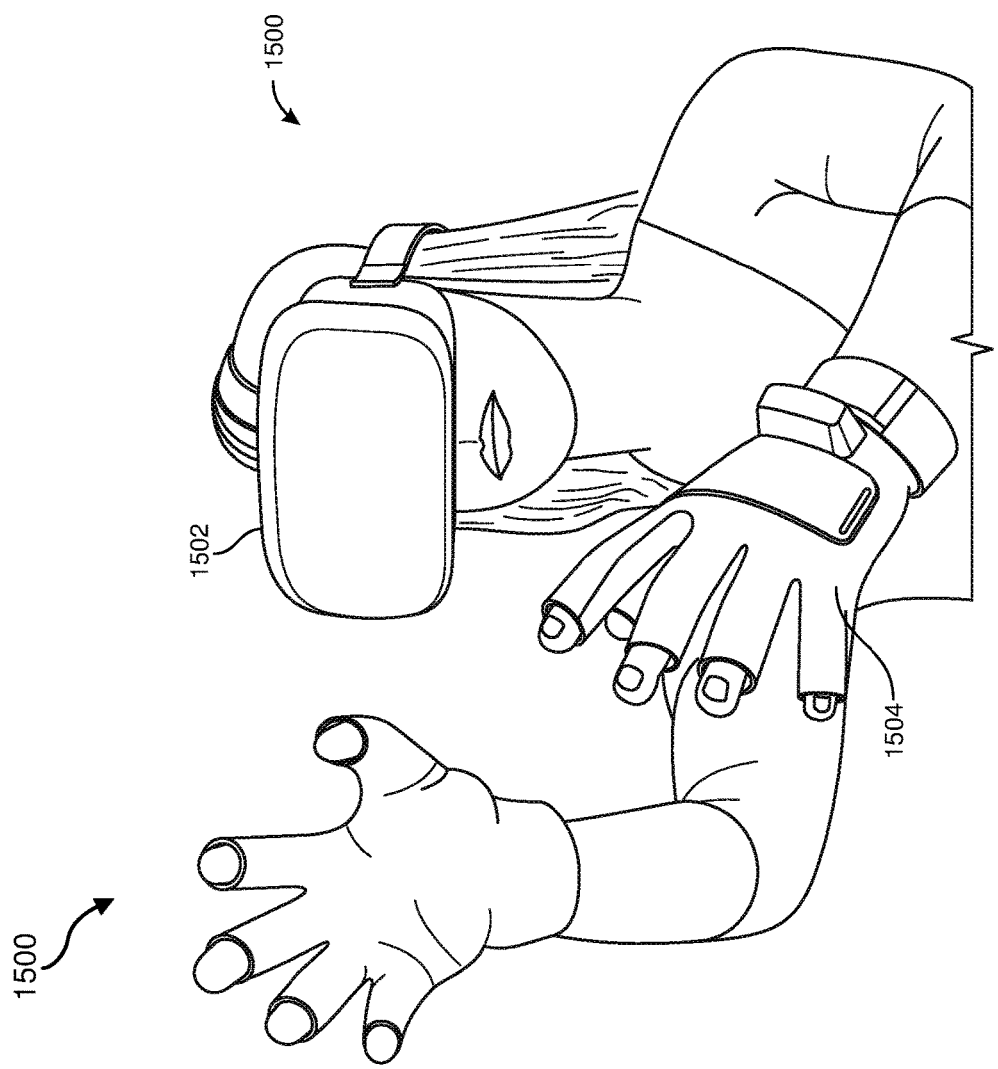
FIG. 15 is an illustration of an exemplary virtual reality environment according to embodiments of this disclosure.

Haptic wearables, such as those shown in and described in connection with FIG. 14, may be implemented in a variety of types of artificial reality systems and environments. FIG. 15 shows an example artificial reality environment 1500 including one head-mounted virtual reality display and two haptic devices (i.e., gloves), and in other embodiments any number and/or combination of these components and other components may be included in an artificial reality system. For example, in some embodiments there may be multiple head-mounted displays each having an associated haptic device, with each head-mounted display and each haptic device communicating with the same console, portable computing device, or other computing system.

Head-mounted display 1502 generally represents any type or form of virtual reality system. Haptic device 1504 generally represents any type or form of wearable device, worn by a use of an artificial reality system, that provides haptic feedback to the user to give the user the perception that he or she is physically engaging with a virtual object. In some embodiments, haptic device 1504 may provide haptic feedback by applying vibration, motion, and/or force to the user. For example, haptic device 1504 may limit or augment a user's movement. To give a specific example, haptic device 1504 may limit a user's hand from moving forward so that the user has the perception that his or her hand has come in physical contact with a virtual wall. In this specific example, one or more actuators within the haptic advice may achieve the physical-movement restriction by pumping fluid into an inflatable bladder of the haptic device. In some examples, a user may also use haptic device 1504 to send action requests to a console. Examples of action requests include, without limitation, requests to start an application and/or end the application and/or requests to perform a particular action within the application.

While haptic interfaces may be used with virtual reality systems, as shown in FIG. 15, haptic interfaces may also be used with augmented reality systems, as shown in FIG. 16. FIG. 16 is a perspective view a user 1610 interacting with an augmented reality system 1600. In this example, user 1610 may wear a pair of augmented reality glasses 1620 that have one or more displays 1622 and that are paired with a haptic device 1630. Haptic device 1630 may be a wristband that includes a plurality of band elements 1632 and a tensioning mechanism 1634 that connects band elements 1632 to one another.

One or more of band elements 1632 may include any type or form of actuator suitable for providing haptic feedback. For example, one or more of band elements 1632 may be configured to provide one or more of various types of cutaneous feedback, including vibration, force, traction, texture, and/or temperature. To provide such feedback, band elements 1632 may include one or more of various types of actuators. In one example, each of band elements 1632 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 1410, 1420, 1504, and 1630 may include any suitable number and/or type of haptic transducer, sensor, and/or feedback mechanism. For example, haptic devices 1410, 1420, 1504, and 1630 may include one or more mechanical transducers, piezoelectric transducers, and/or fluidic transducers. Haptic devices 1410, 1420, 1504, and 1630 may also include various combinations of different types and forms of transducers that work together or independently to enhance a user's artificial-reality experience. In one example, each of band elements 1632 of haptic device 1630 may include a vibrotactor (e.g., a vibrotactile actuator) configured to vibrate in unison or independently to provide one or more of various types of haptic sensations to a user.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A touch-simulation apparatus comprising:
   a set of opposing surfaces that comprises a first surface and a second surface; and
   an electric actuator assembly coupled between the set of opposing surfaces, wherein the electric actuator assembly comprises:
   an actuator;
   a first mechanical amplifier directly attached to a first side of the actuator and the first surface; and
   a second mechanical amplifier directly attached to a second side of the actuator and the second surface.

2. The touch-simulation apparatus of claim 1, wherein the set of opposing surfaces comprises at least one of:
   a set of opposing plates; or
   a plate and a surface of a wearable band.

3. The touch-simulation apparatus of claim 1, wherein at least one of:

the first mechanical amplifier is directly attached to the first surface by an adhesive; or
the second mechanical amplifier is directly attached to the second surface by an adhesive.

4. The touch-simulation apparatus of claim 1, further comprising one or more electrical leads coupled between the electric actuator assembly and an actuation controller, wherein the electrical leads deliver electric current from the actuation controller to the electric actuator assembly for actuating the actuator.

5. The touch-simulation apparatus of claim 4, wherein actuating the actuator comprises at least one of:
expanding the actuator to retract the first and second mechanical amplifiers and the set of opposing surfaces inward toward the actuator; or
contracting the actuator to extend the first and second mechanical amplifiers and the set of opposing surfaces outward from the actuator.

6. The touch-simulation apparatus of claim 1, wherein:
the first surface is coupled to a wearable band dimensioned to be donned by a user of an artificial reality system; and
the second surface is dimensioned for physical contact with skin of the user to facilitate touch simulation for the user in connection with the artificial reality system.

7. The touch-simulation apparatus of claim 1, wherein:
the first surface comprises a bottom side of a box enclosure coupled to a wearable band dimensioned to be donned by a user of an artificial reality system; and
the second surface comprises a top side of the box enclosure that includes a set of casement flaps that:
are each hinged to a wall of the box enclosure; and
form an opening.

8. The touch-simulation apparatus of claim 7, wherein the top side of the box enclosure is dimensioned for physical contact with skin of the user to facilitate touch simulation for the user by opening or closing the casement flaps in connection with the artificial reality system.

9. The touch-simulation apparatus of claim 1, wherein the actuator comprises a piezoelectric ceramic.

10. The touch-simulation apparatus of claim 1, wherein at least one of the opposing surfaces is composed of a plastic material.

11. The touch-simulation apparatus of claim 1, wherein the actuator is positioned parallel to the set of opposing surfaces.

12. The touch-simulation apparatus of claim 1, wherein at least one of the first and second mechanical amplifiers is formed into a cymbal shape.

13. The touch-simulation apparatus of claim 1, further comprising:
another set of opposing surfaces; and
another electric actuator assembly coupled between the another set of opposing surfaces, wherein the another electric actuator assembly comprises:
another actuator; and
another set of mechanical amplifiers coupled between opposing sides of the another actuator and the another set of opposing surfaces.

14. A wearable device comprising:
a wearable band dimensioned to be donned by a user of an artificial reality system; and
at least one touch-simulation device coupled to the wearable band, wherein the touch-simulation device comprises:
a set of opposing surfaces that comprises a first surface and a second surface; and
an electric actuator assembly coupled between the set of opposing surfaces, wherein the electric actuator assembly comprises:
an actuator; and
a first mechanical amplifier directly attached to a first side of the actuator and the first surface; and
a second mechanical amplifier directly attached to a second side of the actuator and the second surface.

15. The wearable device of claim 14, wherein the set of opposing surfaces comprises at least one of:
a set of opposing plates; or
a plate and a surface of the wearable band.

16. The wearable device of claim 14, wherein at least one of:
the first mechanical amplifier is directly attached to the first surface by an adhesive; or
the second mechanical amplifier is directly attached to the second surface by an adhesive.

17. The wearable device of claim 14, further comprising one or more electrical leads coupled between the electric actuator assembly and an actuation controller, wherein the electrical leads deliver electric current from the actuation controller to the electric actuator assembly for actuating the actuator.

18. The wearable device of claim 17, wherein actuating the actuator comprises at least one of:
expanding the actuator to retract the first and second mechanical amplifiers and the set of opposing surfaces inward toward the actuator; or
contracting the actuator to extend the first and second mechanical amplifiers and the set of opposing surfaces outward from the actuator.

19. The wearable device of claim 14, wherein:
the first surface is coupled to the wearable band dimensioned to be donned by the user of the artificial reality system; and
the second surface is dimensioned for physical contact with skin of the user to facilitate touch simulation for the user in connection with the artificial reality system.

20. A method comprising:
manufacturing an electric actuator assembly that comprises:
an actuators;
a first mechanical amplifier; and
a second mechanical amplifier;
directly attaching the first mechanical amplifier to a first side of the actuator and a first surface;
directly attaching the second mechanical amplifier to a second side of the actuator and a second surface; and
incorporating the electric actuator assembly into a wearable device dimensioned to be donned by a user of an artificial reality system such that the wearable device is able to facilitate, via the electric actuator assembly, touch simulation for the user in connection with the artificial reality system.

* * * * *

UNITED STATES PATENT AND TRADEMARK OFFICE
CERTIFICATE OF CORRECTION

PATENT NO. : 11,194,397 B1
APPLICATION NO. : 16/810885
DATED : December 7, 2021
INVENTOR(S) : Dongsuk Shin et al.

It is certified that error appears in the above-identified patent and that said Letters Patent is hereby corrected as shown below:

In the Claims

In Column 22, Line 49 (approx.), in Claim 20, delete "actuators;" and insert -- actuator; --.

Signed and Sealed this
Twenty-sixth Day of April, 2022

Katherine Kelly Vidal
*Director of the United States Patent and Trademark Office*